(12) United States Patent
Hwang et al.

(10) Patent No.: US 7,969,087 B2
(45) Date of Patent: Jun. 28, 2011

(54) ORGANIC LIGHT EMITTING DIODE DISPLAY AND METHOD FOR MANUFACTURING THE SAME

(75) Inventors: Young-In Hwang, Yongin-si (KR); Baek-Woon Lee, Yongin-si (KR); Hae-Yeon Lee, Bucheon-si (KR); Young-Gu Ju, Daegu-si (KR)

(73) Assignees: Samsung Electronics Co., Ltd. (KR); Kyungpook National University Industry Academic Cooperation Foundation (KR)

( * ) Notice: Subject to any disclaimer, the term of this patent is extended or adjusted under 35 U.S.C. 154(b) by 186 days.

(21) Appl. No.: 12/418,390

(22) Filed: Apr. 3, 2009

(65) Prior Publication Data

US 2009/0251051 A1    Oct. 8, 2009

(30) Foreign Application Priority Data

Apr. 4, 2008  (KR) .................. 10-2008-0031605

(51) Int. Cl.
*H01J 1/62* (2006.01)
(52) U.S. Cl. ..................... 313/504; 313/506

(58) Field of Classification Search .................. 313/498, 313/504, 506, 509
See application file for complete search history.

(56) References Cited

U.S. PATENT DOCUMENTS

2009/0261716 A1* 10/2009 Choi et al. ................. 313/504
2010/0026178 A1*  2/2010 Hwang et al. ............. 313/506

* cited by examiner

*Primary Examiner* — Vip Patel
(74) *Attorney, Agent, or Firm* — Innovation Counsel LLP

(57) ABSTRACT

An organic light emitting device including a first pixel, a second pixel, and a third pixel displaying different colors from each other according to the present invention is disclosed, wherein the organic light emitting device includes a substrate, a pixel electrode formed on the substrate, a reflecting electrode facing the pixel electrode, an emission layer disposed between the pixel electrode and the reflecting electrode, and a transflective member forming a micro-cavity along with the reflecting electrode, wherein a optical path length is a distance between the reflecting electrode and the transflective member, and the optical path lengths of at least two pixels among the first pixel, the second pixel, and the third pixel are the same, and the transflective member is removed in the white pixel.

17 Claims, 25 Drawing Sheets

FIG. 2

| | | | | |
|---|---|---|---|---|
| B | W | B | W | B |
| G | R | G | R | G |
| B | W | B | W | B |
| G | R | G | R | G |
| B | W | B | W | B |

ORGANIC LIGHT EMITTING DIODE DISPLAY AND METHOD FOR MANUFACTURING THE SAME

CROSS-REFERENCE TO RELATED APPLICATION

This application claims priority to, and the benefit of, Korean Patent Application No. 10-2008-0031605 filed in the Korean Intellectual Property Office on Apr. 4, 2008, the entire contents of which are incorporated herein by reference.

BACKGROUND OF THE INVENTION (a) Field of the Invention

The present invention relates generally to visual displays. More specifically, the present invention relates to an organic light emitting device and a manufacturing method thereof.

(b) Description of the Related Art

Demand for lighter or thinner monitors and TVs is currently increasing, and cathode ray tubes (CRTs) are being replaced by liquid crystal displays (LCDs). However, because the LCD is a passive display device, an additional back-light is needed as a light source. Additionally, LCD displays have additional challenges, such as relatively slow response time and narrow viewing angle.

Among the flat panel displays, organic light emitting devices (organic light emitting diode display, OLED display) have recently been the most promising as a display device for solving these problems. The organic light emitting device includes two electrodes and an organic light emitting layer interposed between the two electrodes. One of the two electrodes injects holes, and the other injects electrons, into the light emitting layer. The injected electrons and holes are combined to form excitons, and the excitons emit light as discharge energy. Because the organic light emitting device is a self-emissive display device, an additional light source is not necessary. The organic light emitting device thus has lower power consumption, as well as relatively high response speed, wide viewing angle, and high contrast ratio.

Typically, the organic light emitting device includes a plurality of pixels such as red pixels, blue pixels, and green pixels, and images of full colors may be displayed by selectively combining these pixels. Also, a white pixel may be further included in addition to the red pixel, the blue pixel, and the green pixel to improve the luminance. However, the various light emitting materials used in the organic light emitting device have different light emitting efficiencies. This presents a challenge when materials having excessively low light emitting efficiencies fail to accurately reproduce colors.

To improve the light emitting efficiency, a micro-cavity may be used. In a micro-cavity, light is repeatedly reflected between a reflection layer and a transflective layer that are separated by a predetermined distance (an optical path length), such that a strong interference effect is generated in the light. Accordingly, light of a specific wavelength reflects constructively, and light of remaining wavelengths reflects destructively. By tuning the micro-cavity to desired wavelengths, the luminance and the color reproducibility of the display may be simultaneously improved.

However, this approach tends to require micro-cavities for each pixel, increasing the number of fabrication processes, and thus increasing fabrication time. Also, the presence of micro-cavities in white pixels may alter a portion of the white spectrum.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention can be implemented as a device and as a method of manufacture.

In one embodiment, an organic light emitting device includes a first pixel, a second pixel, and a third pixel displaying different colors from each other. The organic light emitting device includes a substrate, a pixel electrode formed on the substrate, a reflecting electrode facing the pixel electrode, an emission layer disposed between the pixel electrode and the reflecting electrode, and a transflective member forming a micro-cavity with the reflecting electrode. Here, an optical path length is a distance between the reflecting electrode and the transflective member. Optical path lengths of at least two of the first pixel, the second pixel, and the third pixel are substantially the same. Also, the transflective member is removed from a one of the first pixel, the second pixel, and the third pixel that is a white pixel.

The substrate and the pixel electrode of the white pixel may contact each other.

The transflective member may include a plurality of layers of which a first layer and a second layer having different refractive indexes are alternatively deposited, and at least one of the layers is removed in a portion among the first pixel, the second pixel, and the third pixel.

The optical path lengths of the first pixel and the second pixel may be the same, and at least one layer may be formed in the first pixel and the second pixel and not in the third pixel.

The first pixel may be a red pixel, the second pixel may be a blue pixel, and the third pixel may be a green pixel.

The optical path length $L_1$ of the first pixel and the second pixel may satisfy $L_1 = m\lambda_1/2 = (m+1)\lambda_2/2$ and the optical path length $L_2$ of the third pixel may satisfy $L_2 = m\lambda_3/2$, where m is a natural number, $\lambda_1$ is a wavelength of the red region, $\lambda_2$ is a wavelength of the blue region, and $\lambda_3$ is a wavelength of the green region.

The optical path lengths of the first pixel and the second pixel may be the same, and at least one of the layers may be formed in the third pixel and is removed in the first pixel and the second pixel.

The first pixel may be a red pixel, the second pixel may be a blue pixel, and the third pixel may be a green pixel.

The optical path length $L_1$ of the first pixel and the second pixel may satisfy $L_1 = m\lambda_1/2 = (m+1)\lambda_2/2$ and the optical path length $L_2$ of the third pixel may satisfy $L_2 = (m+1)\lambda_3/2$, and wherein $\lambda_1$ may be a wavelength of the red region, $\lambda_2$ may be a wavelength of the blue region, and $\lambda_3$ may be a wavelength of the green region.

The organic light emitting device may further include a thin film transistor formed on the substrate, an insulating layer formed on or under of the thin film transistor, and an overcoat formed on the insulating layer, and the insulating layer may be removed in the light emitting region of the white pixel.

The insulating layer may be removed in the light emitting regions of the first pixel, the second pixel, and the third pixel.

The overcoat may be removed in the white pixel.

Color filters respectively formed in the first pixel, the second pixel, and the third pixel may be further included.

The emission layer include a plurality of sub-emission layers emitting light of different wavelengths, and a white light may be emitted by combining the light of the different wavelengths.

In a further embodiment, a method of manufacturing an organic light emitting device having a plurality of pixels displaying different colors from each other comprises forming a thin film transistor on a substrate. The method also includes forming a transflective member including a first layer and a second layer, the first layer and the second layer having different refractive indices and being alternately deposited on the substrate and the thin film transistor. The method further includes removing a portion of the transflective member from a first pixel, a second pixel, and a third pixel, and removing the transflective member of a white pixel. Additionally, the method includes forming a pixel electrode connected to the thin film transistor, forming an emission layer on the pixel electrode, and forming a reflecting electrode on the emission layer.

The manufacturing method may further include forming an insulating layer, forming a color filter on the insulating layer, forming an overcoat on the color filter, and forming a plurality of contact holes connecting the thin film transistor and the pixel electrode to each other in at least one of the insulating layer and the overcoat, before the forming of the transflective member, wherein the insulating layer disposed in the light emitting region of the white pixel is removed when forming the contact holes.

The insulating layer disposed in the light emitting region of the first pixel, the second pixel, and the third pixel may be removed when forming the contact hole.

The removing of the transflective member may include removing the highest layer of the transflective member in a portion of the first pixel, the second pixel, and the third pixel, and the highest layer of the transflective member in the white pixel, and removing the transflective member remaining in the white pixel.

A contact hole may be formed in the transflective member of the portion of the first pixel, the second pixel, and the third pixel when removing the highest layer of the transflective member of the white pixel, and a contact hole may be formed in the transflective member of the first pixel, the second pixel, and the third pixel when removing the remained transflective member of the white pixel.

The first layer and the second layer may be made of one selected from a silicon nitride layer and a silicon oxide layer, and the silicon nitride layer may be etched by using $CF_4$ and $O_2$ and the silicon oxide layer is etched by using $C_4F_8$ and $H_2$.

The pixel electrode of the white pixel may be formed directly on the substrate.

In a further embodiment, a method of manufacturing an organic light emitting device having a plurality of pixels displaying different colors from each other comprises forming a plurality of thin film transistors on a substrate, and forming an insulating layer on the thin film transistor. The method also includes etching the insulating layer to form first contact holes exposing the thin film transistors in a first pixel, a second pixel, a third pixel, and a white pixel and to remove the insulating layer disposed in a light emitting region of the white pixel. Furthermore, the method includes forming a transflective member on the insulating layer by alternatively depositing a first layer and a second layer having different refractive indices, and removing a highest layer of the transflective member from a portion of each of the first pixel, the second pixel, and the third pixel, and from the white pixel. The method further includes forming second contact holes through the transflective member and exposing the first contact holes, and removing a remaining portion of the transflective member from the white pixel. Additionally included are forming pixel electrodes on the substrate and the transflective member over the first pixel, the second pixel, and the third pixel, forming an emission layer on the pixel electrodes; and forming a reflecting electrode on the emission layer.

The manufacturing method may further include forming a color filter on the insulating layer, forming an overcoat on the color filter, and forming a third contact hole exposing the first contact hole in the color filter and the overcoat and removing the overcoat of the white pixel before forming the transflective member.

The transflective member, the overcoat, and the lower insulating layer are removed in the white pixel such that the light emitted from the emission layer is only passed through the pixel electrode and the substrate and is emitted to the outside. Therefore, it is prevented that the light is changed by the refractive index of each thin film when passing the thin films and the unique white light may be emitted. The amount of light that is absorbed by each thin film among the light emitted from the organic emission layer is reduced, thereby improving the light emitting efficiency.

For this micro-cavity effect, the optical path lengths of at least two pixels among the red pixel, the green pixel, and the blue pixel are the same such that the required processes for forming the different optical path lengths for each pixel may be reduced.

BRIEF DESCRIPTION OF THE DRAWINGS

FIG. 2 is a schematic diagram showing an arrangement of a plurality of pixels in the organic light emitting device according to an exemplary embodiment of the present invention.

DETAILED DESCRIPTION OF THE EMBODIMENTS

Figure 1:
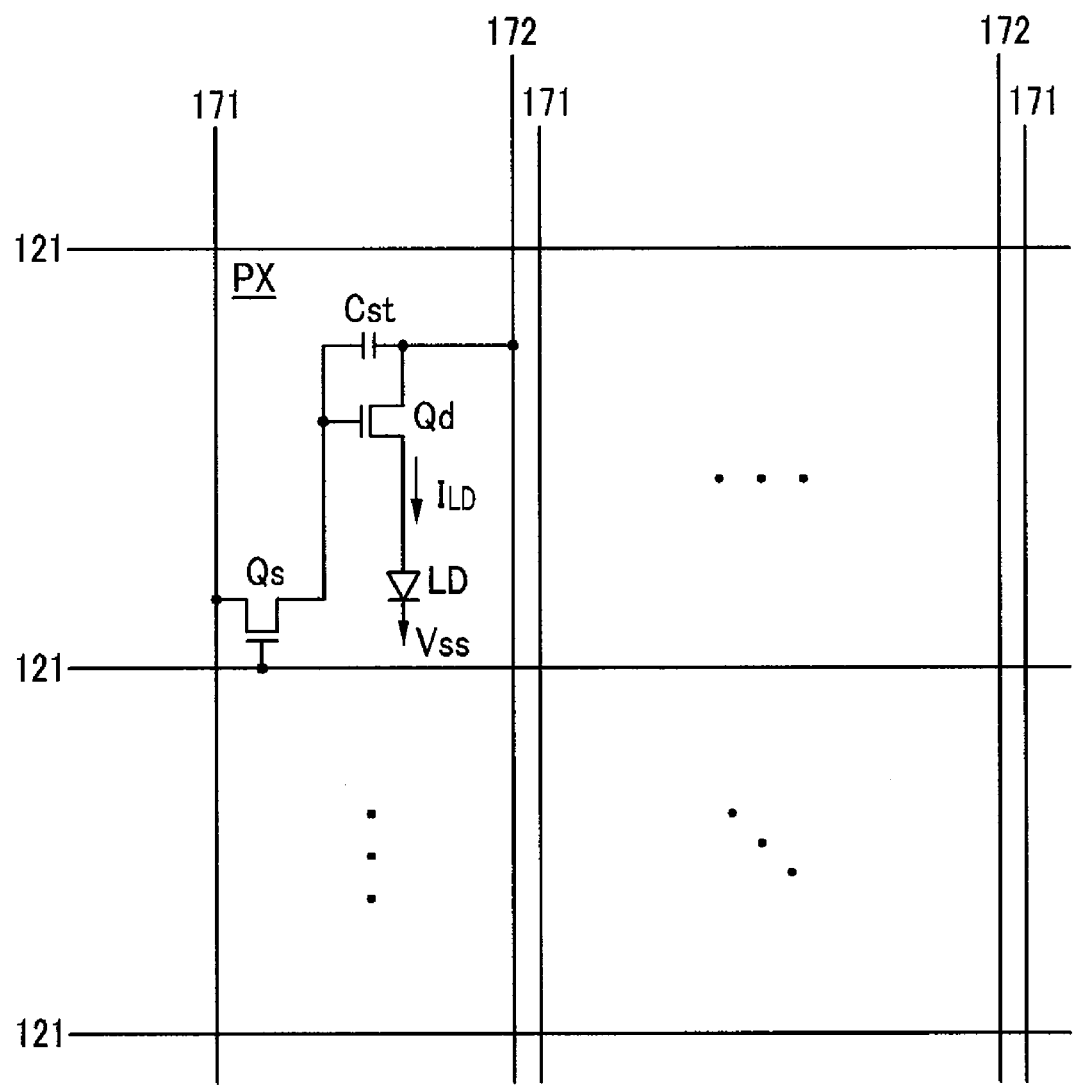
FIG. 1 is an equivalent circuit diagram of an organic light emitting device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

Now, an organic light emitting device according to an embodiment of the present invention will be described in detail with reference to FIG. 1. FIG. 1 is an equivalent circuit diagram of an organic light emitting device according to an exemplary embodiment of the present invention. Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qd, a capacitor Cst, and an organic light emitting diode (OLED) LD. The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121. The driving transistor Qd has a control terminal connected to the switching transistor Qs, an input terminal connected to the driving voltage line 172, and an output terminal connected to the organic light emitting element. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd, and maintains the data signal after the switching transistor Qs turns off.

The organic light emitting diode LD has an anode connected to the output terminal of the driving transistor Qd, and a cathode connected to a common voltage Vss. The organic light emitting diode LD emits light having an intensity depending on an output current ILD of the driving transistor Qd, thereby displaying images.

The switching transistor Qs and the driving transistor Qd can be n-channel field effect transistors (FETs). However, at least one of the switching transistor Qs and the driving transistor Qd may also be a p-channel FET. In addition, the connections among the transistors Qs and Qd, the capacitor Cst, and the organic light emitting diode LD may be modified.

Figure 2:
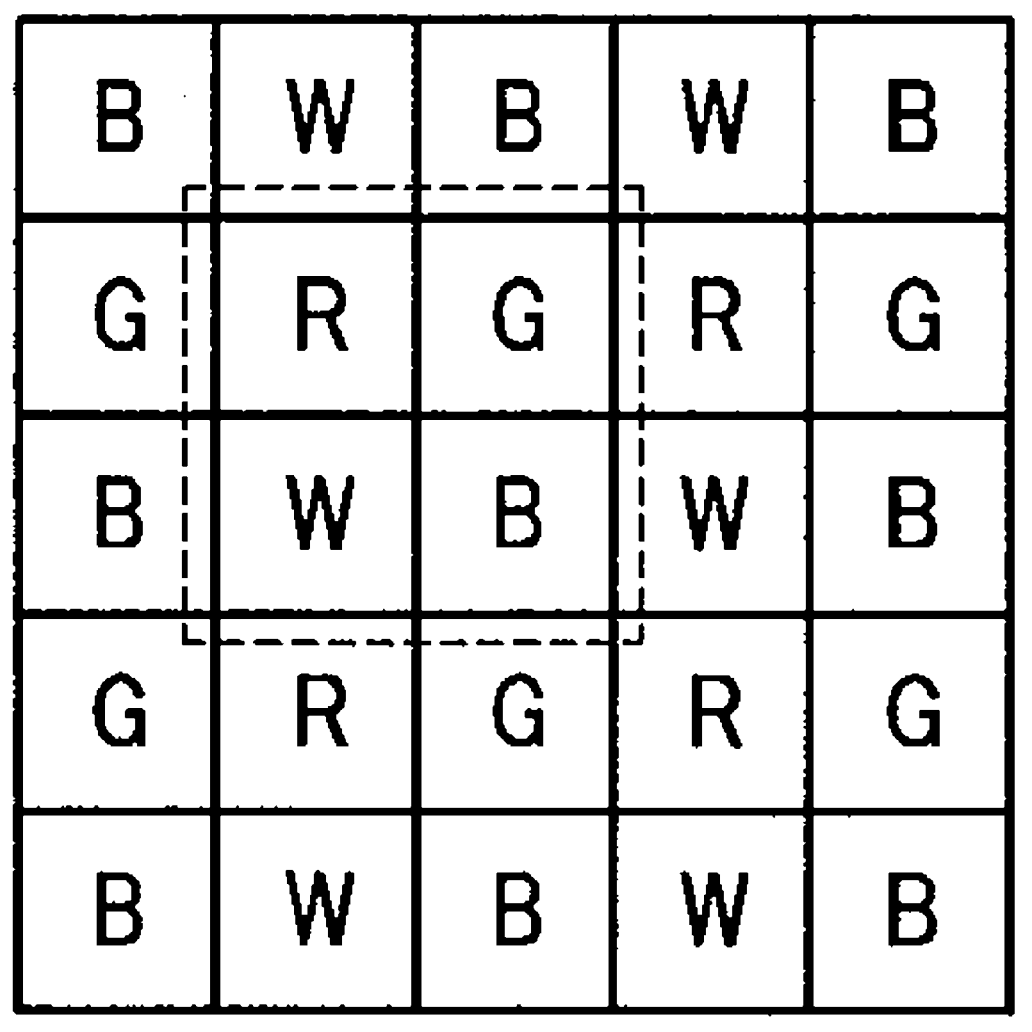
Figure 3:
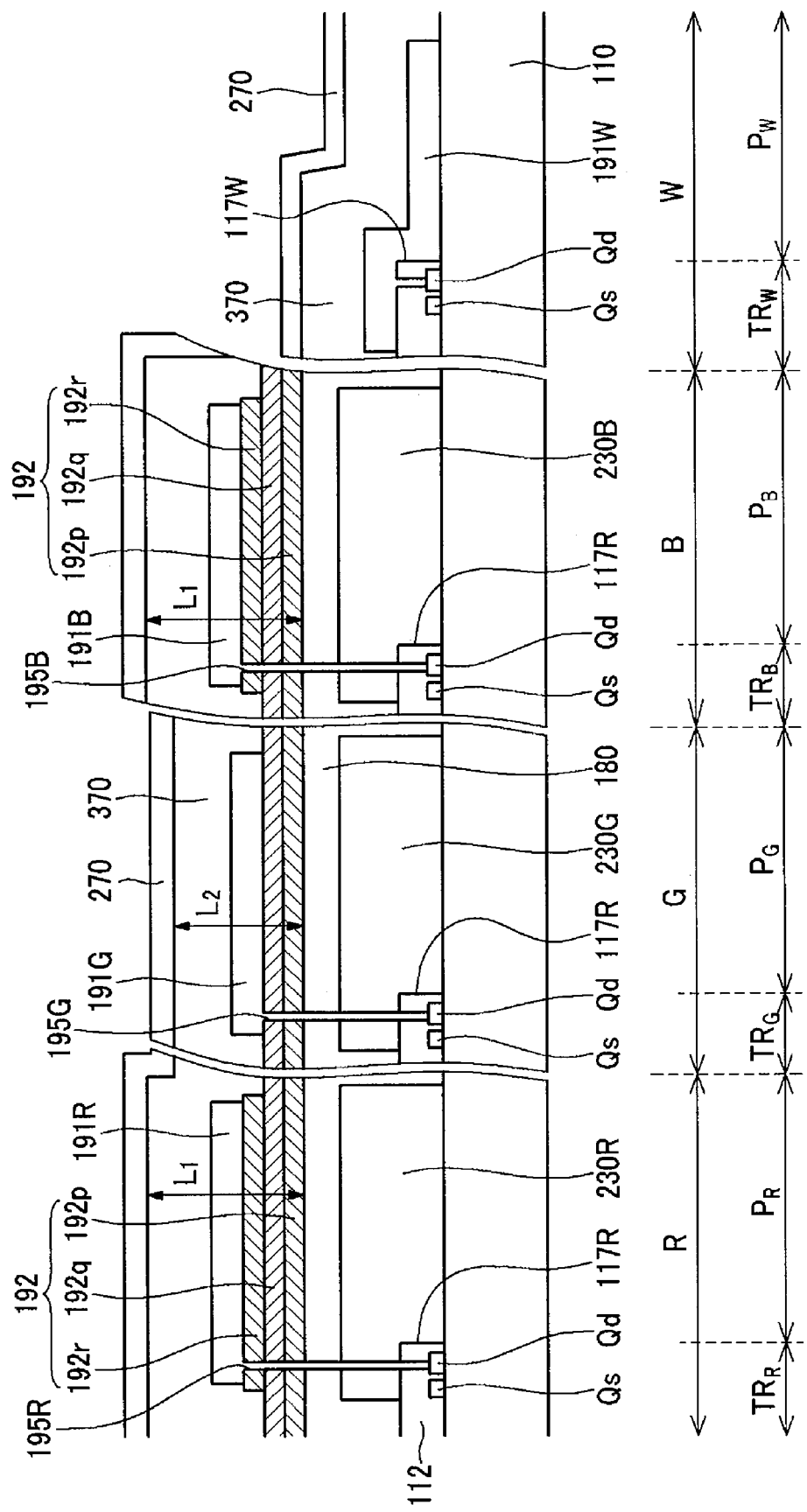
FIG. 3 is a cross-sectional view showing four neighboring pixels R, G, B, and W in the organic light emitting device shown in FIG. 2.
Figure 4:
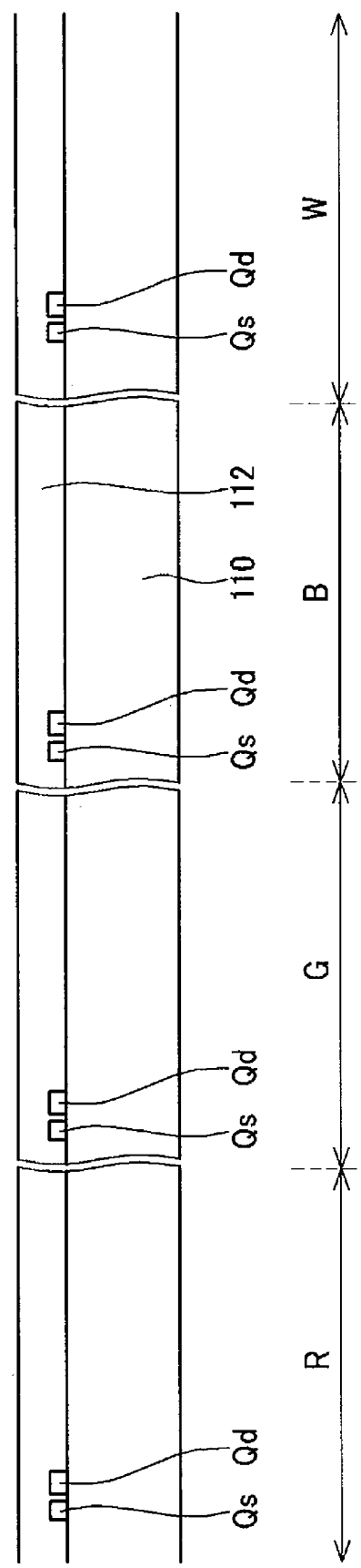
FIG. 4 to FIG. 13 are cross-sectional views sequentially showing the manufacturing method of the organic light emitting device shown in FIG. 3 according to an exemplary embodiment of the present invention.

Next, the detailed structure of the organic light emitting device shown in FIG. 1 will be described with reference to FIG. 2 and FIG. 3 as well as FIG. 1. FIG. 2 is a top plan view schematically showing an arrangement of a plurality of pixels in an organic light emitting device according to an exemplary embodiment of the present invention, and FIG. 3 is a cross-sectional view showing four neighboring pixels R, G, B, and W in the organic light emitting device shown in FIG. 2. Referring to FIG. 2, the organic light emitting device according to an exemplary embodiment of the present invention includes red pixels R for displaying a red color, green pixels G for displaying a green color, blue pixels B for displaying a blue color, and white pixels W for displaying a white color, which are sequentially and alternately disposed. The organic light emitting device further includes the white pixels W to improve the luminance as well as the red pixels R, the green pixels G, and the blue pixels B to display full colors. Four pixels of a red pixel R, a green pixel G, a blue pixel B, and a white pixel W form one group, and may be repeatedly arranged according to rows and/or columns. However, the arrangement and the shape of the pixels may vary.

Next, a detailed structure of an organic light emitting device according to an exemplary embodiment of the present invention will be described with reference to FIG. 3. In FIG. 3, the red pixel (R), green pixel (G), blue pixel (B), and white pixel (W) of the organic light emitting device shown in FIG. 2 are indicated by dotted lines, and form one pixel group. Each of the pixels R, G, B, and W respectively includes a thin film transistor region $TR_R$, $TR_G$, $TR_B$, and $TR_W$, and a light emitting region $P_R$, $P_G$, $P_B$, and $P_W$. The thin film transistor regions $TR_R$, $TR_G$, $TR_B$, and $TR_W$ are regions where the thin film transistor array, including the switching thin film transistor Qs and the driving thin film transistor Qd are formed. The light emitting regions $P_R$, $P_G$, $P_B$, and $P_W$ are regions where the light emitted from the emission layer passes through the substrate and is emitted from the device. A plurality of thin film transistor arrays are arranged on an insulating substrate 110. The thin film transistor array includes a switching thin film transistor Qs and driving thin film transistor Qd that are arranged in each pixel R, G, B, and W and are electrically connected to each other.

A lower insulating layer 112 is formed on the thin film transistor array and the substrate 110. The insulating layer 112 is removed on the light emitting regions $P_R$, $P_G$, $P_B$, and $P_W$ of each pixel R, G, B, and W, and the removed portions form openings 117R, 117G, 117B, and 117W exposing the substrate 110.

Red filters 230R, green filters 230G, and blue filters 230B are respectively formed in the red pixels, green pixels, and blue pixels on the lower insulating layer 112, and a color filter or transparent white color filters (not shown) may be formed in the white pixels W. The color filters 230R, 230G, and 230B may be disposed as a color filter on array (COA) type filter.

An overcoat 180 is formed on the color filters 230R, 230G, and 230B. The overcoat 180 is removed in the light emitting regions W of the white pixels W. However, the overcoat 180 need not be removed from the light emitting regions W if it generates too large a step between the white pixel W and the red pixel R, the green pixel G, and/or the blue pixel B.

A transflective member 192 is formed on the overcoat 180. The transflective member 192 has characteristics such that a portion of light is transmitted and a portion of light is reflected, and uses distributed Bragg reflection (DBR) for controlling the reflection ratio of the specific wavelength. The transflective member 192 includes a plurality of layers that are alternately deposited and that are preferably made of inorganic materials having different refractive indexes. Use of such inorganic materials can yield less light loss than use of a metal.

In the embodiment of FIG. 3, transflective member 192 includes a lower layer 192p, a middle layer 192q, and an upper layer 192r. While the transflective member 192 is shown as having three layers, the invention is not limited to this configuration, and includes embodiments in which the transflective member 192 has N layers. Here, the N layers may include an (N−1) layer in which the lower layer 192p and the middle layer 192q are alternately deposited, and the upper layer 192r is not present in the green pixel G. This is to control the optical path length in the red pixel R, the green pixel G, and the blue pixel B, and will be described later.

The transflective member 192 can be completely removed in the white pixel W. The white pixel W includes visible rays of all wavelengths, such that it is not necessary to amplify the light of a special wavelength, rendering the transflective member 192 for forming the micro-cavity unnecessary.

The lower layer 192p and the upper layer 192r are made of the same material having a first refractive index, and the middle layer 192q is made of a material having a second refractive index. For example, the lower layer 192p and the upper layer 192r may be made of silicon nitride SiNx having a refractive index of about 1.8, and the middle layer 192q may be made of silicon oxide SiO2 having a refractive index of about 1.5.

Pixel electrodes 191R, 191G, 191B, and 191W are formed on the transflective member 192. For example, the pixel electrode 191 may be made of a transparent conductor such as ITO or IZO, and functions as an anode. An organic light emitting member is then formed on the pixel electrodes 191R, 191G, 191B, and 191W. The organic light emitting members may include an auxiliary layer (not shown) for improving light emitting efficiency, as well as light emission layers 370 for emitting light.

The emission layers 370 may include a plurality of sequentially deposited sub-emission layers of materials uniquely emitting red, green, and blue light, and may emit white light by combining their wavelengths of light. The present invention is not limited to vertically forming the sub-emission layers, as the sub-emission layers may also be horizontally formed. Additionally, the combination of light to produce white light is not limited to red, green, and blue color light. The sub-emission layers may be formed with various color combinations that collectively produce white light.

In addition, the auxiliary layer may include at least one layer selected from an electron transport layer (not shown) and a hole transport layer (not shown), and an electron injecting layer (not shown) and a hole injecting layer (not shown).

A common electrode 270 is formed on the organic light emitting member. The common electrode 270 is preferably made of a material with high reflectance, and functions as a cathode electrode. The common electrode 270 is formed to cover the whole surface of the substrate 110, and forms a pair with each of the pixel electrodes 191R, 191G, 191B, and 191W that function as the anode electrodes to flow the current to the organic light emitting member.

In an exemplary embodiment of the present invention, the transflective member 192 generates a micro-cavity effect along with the common electrode 270. The micro-cavity effect occurs when light is repeatedly reflected between a reflection layer and transflective layers, which are spaced from each other by a predetermined distance (hereinafter, "micro-cavity length") such that light of a predetermined wavelength is enhanced by constructive interference. Here, the common electrode 270 functions as the reflection layer, and the transflective member 192 functions as a transflective layer. The common electrode 270 changes the light emitting characteristics of the light from the light emission layers 370, and light near a wavelength corresponding to the resonance wavelength of the micro-cavity is enhanced through constructive interference, while light of different wavelengths is suppressed by destructive interference. The enhancement and the suppression of such light may be determined according to the length of the light path. The length of the light path should satisfy the constructive interference condition for each wavelength of light from the red, green, and blue pixels. The lengths of the light path, the optical path length of at least two pixels in the red pixel R, the blue pixel B, and the green pixel G are the same in an exemplary embodiment of the present invention. For example, as shown in FIG. 3, the optical path length $L_1$ of the red pixel R and the blue pixel B are the same, and the optical path length $L_1$ may be determined as a value that simultaneously satisfies the constructive interference condition in the wavelength of the red region and the wavelength of the blue region. The optical path length $L_1$ that simultaneously satisfies the constructive interference condition in the red pixel R and the blue pixel B may be represented as in Equation 1.

$$L_1 = m\lambda_1/2 = (m+1)\lambda_2/2 \tag{1}$$

Here, m is a natural number, $\lambda_1$ is a wavelength of the red region, and $\lambda_2$ is a wavelength of the blue region. For example, it may be that m=1.

Optical path lengths of at least two pixels among the red pixel R, the blue pixel B, and the green pixel G can be the same, so that the processes required for forming the different optical path lengths for each pixel may be reduced. That is, to form the different optical path lengths for each pixel, at least three photolithography processes to form different thicknesses of the transflective members 192 disposed in each pixel are required, or the emitting materials are respectively deposited in each pixel by using shadow masks to form the different thicknesses of the organic light emitting members including the light emission layers 370. However, if optical path lengths of at least two pixels among the red pixel R, the blue pixel B, and the green pixel G are the same, the number of required processes may be reduced.

On the other hand, the optical path length $L_2$ of the green pixel G is different from the optical path length $L_1$ of the red pixel R and the blue pixel B. For example, as shown in FIG. 3, the optical path length $L_2$ of the green pixel G may be less than the optical path length $L_1$ of the red pixel R and the blue pixel B. When the optical path length $L_2$ of the green pixel G is less than the optical path length $L_1$ of the red pixel R and the blue pixel B, the optical path length $L_2$ of the green pixel G may be represented as in Equation 2.

$$L_2 = m\lambda_3/2 \tag{2}$$

Here, m is a natural number and $\lambda_3$ is a wavelength of the green region.

The optical path lengths $L_1$ and $L_2$ may be determined by the transflective member 192, as the above-described upper layer 192r is only formed in the red pixel R and the blue pixel B, and is not present in the green pixel G. That is, the thickness of the upper layer 192r may control the optical path length. Further, the white pixel W does not have a micro-cavity, and there is thus no need to control its optical path length.

Now, a manufacturing method of the organic light emitting device shown in FIG. 3 will be described with reference to FIG. 4 to FIG. 13. FIG. 4 to FIG. 13 are cross-sectional views sequentially showing a manufacturing method for fabricating the organic light emitting device shown in FIG. 3 according to an exemplary embodiment of the present invention. Referring FIG. 4, a plurality of thin film transistor arrays, including a plurality of switching thin film transistors Qs and a plurality of driving thin film transistors Qd, are formed on an insulating substrate 110. Here, the forming of the switching thin film transistor Qs and the driving thin film transistor Qd include deposition and patterning of a conductive layer, an insulating layer, and a semiconductor layer.

Next, a lower insulating layer 112 is deposited on the thin film transistor array and substrate 110. The lower insulating layer 112 may be formed by chemical vapor deposition or any other suitable process.

Figure 5:
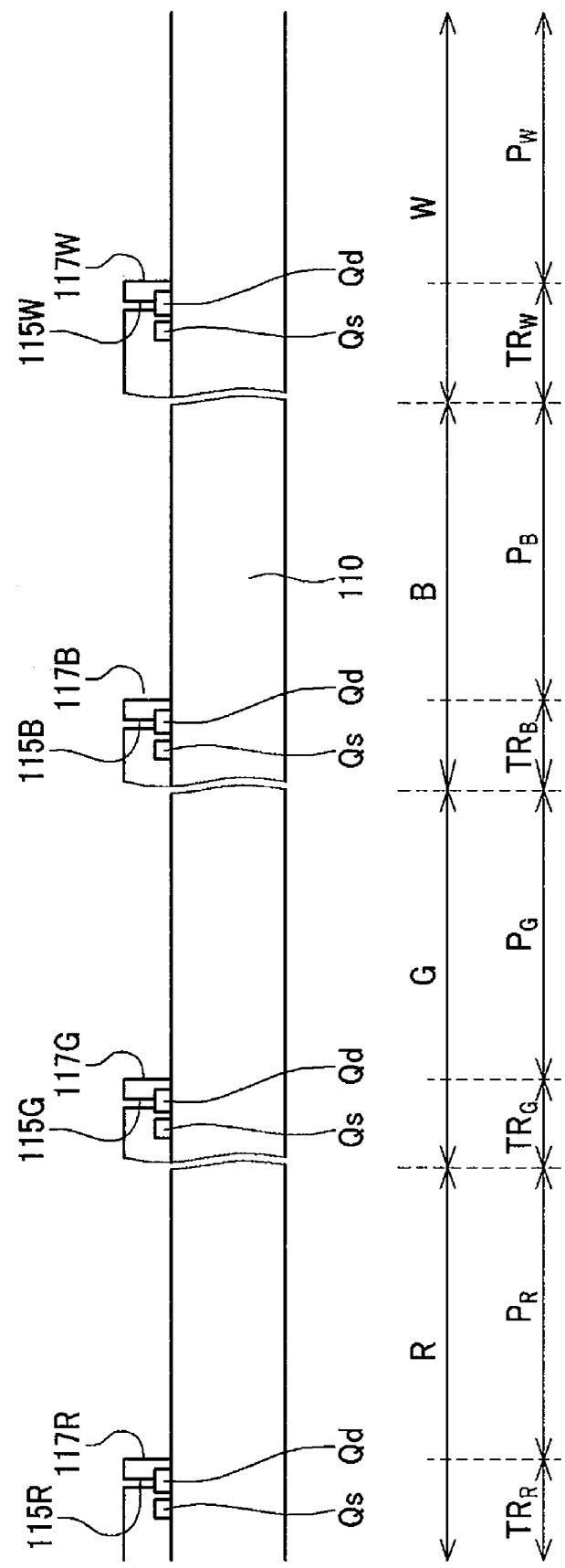
Figure 6:
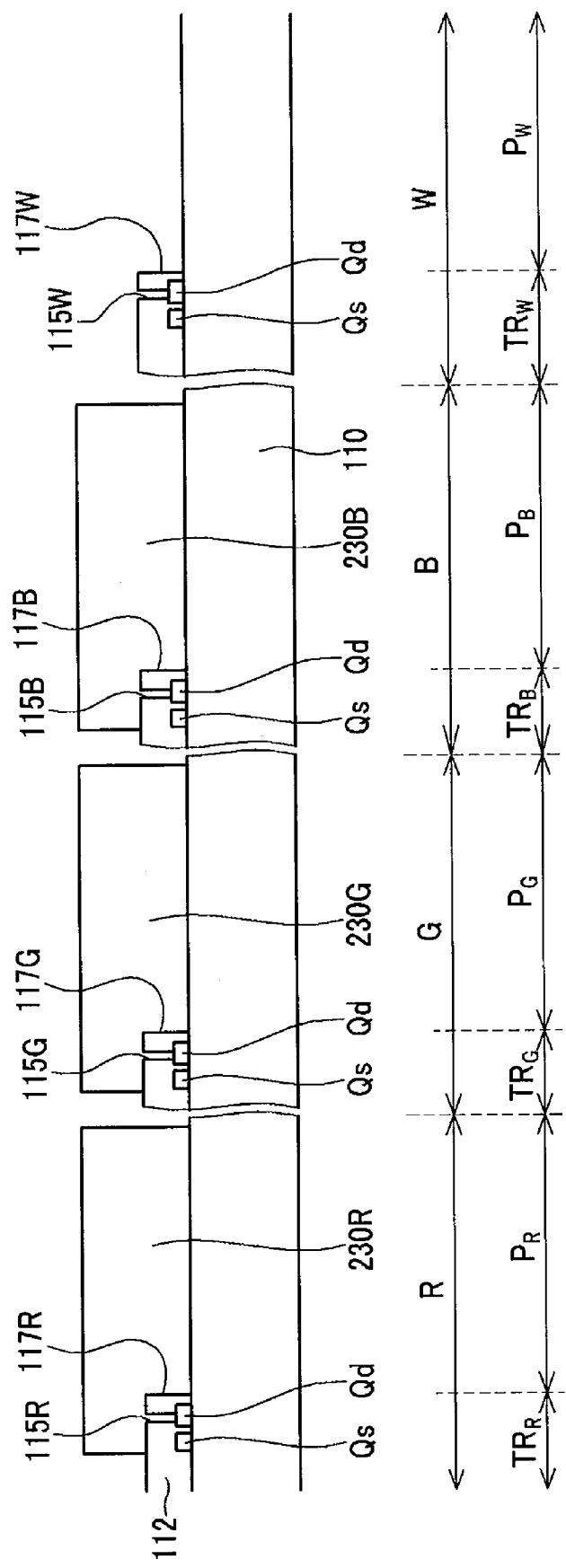

Next, referring to FIG. 5, the lower insulating layer 112 is patterned to form a plurality of lower contact holes 115R, 115G, 115B, and 115W respectively exposing the driving thin film transistor Qd of the red pixel R, the green pixel G, the blue pixel B, and the white pixel W. Also, the lower insulating layer 112 (disposed in the light emitting regions $P_R$, $P_G$, $P_B$, and $P_W$ of the red pixel R, the green pixel G, the blue pixel B, and the white pixel W) is removed to form a plurality of openings 117R, 117G, 117B, and 117W exposing the substrate 110. Next, referring to FIG. 6, a plurality of color filters 230R, 230G, and 230B are formed on the lower insulating layer 112 and the substrate 110. A color filter is not formed in the white pixel W.

Figure 7:
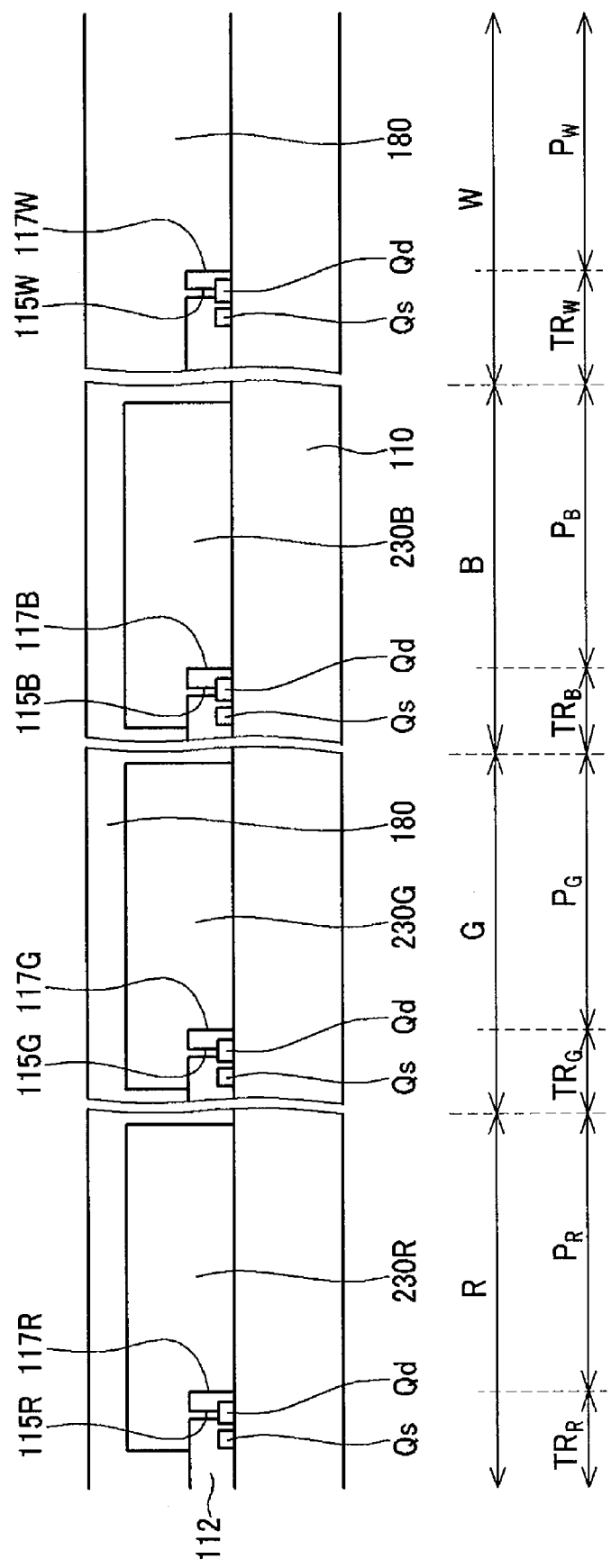
Figure 8:
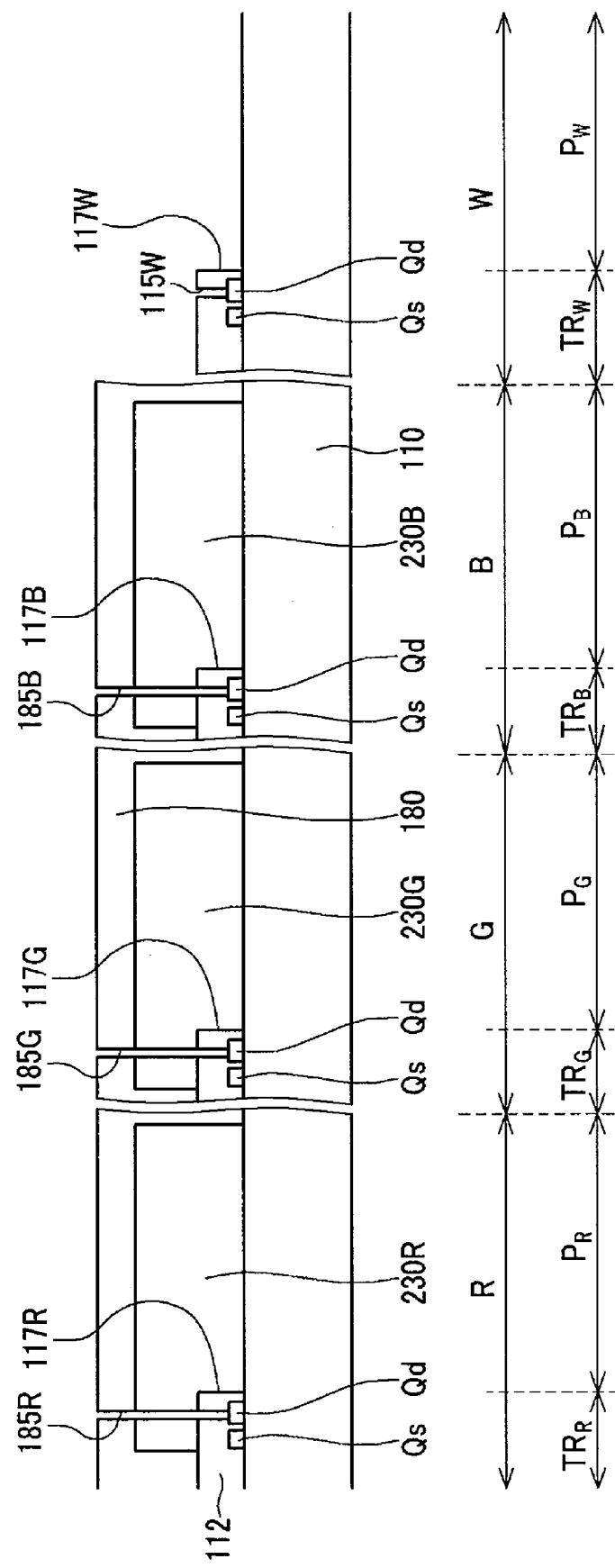

Next, referring to FIG. 7, an overcoat 180 is formed on the whole surface of the substrate including the lower insulating layer 112 and the color filters 230R, 230G, and 230B. Referring to FIG. 8, the overcoat 180 and the color filters 230R, 230G, and 230B are patterned to form a plurality of middle contact holes 185R, 185G, and 185B respectively exposing the lower contact holes 115R, 115G, and 115B, and to remove the overcoat 180 of the white pixel W. However, the overcoat 180 may be not removed in the white pixel W.

Figure 9:
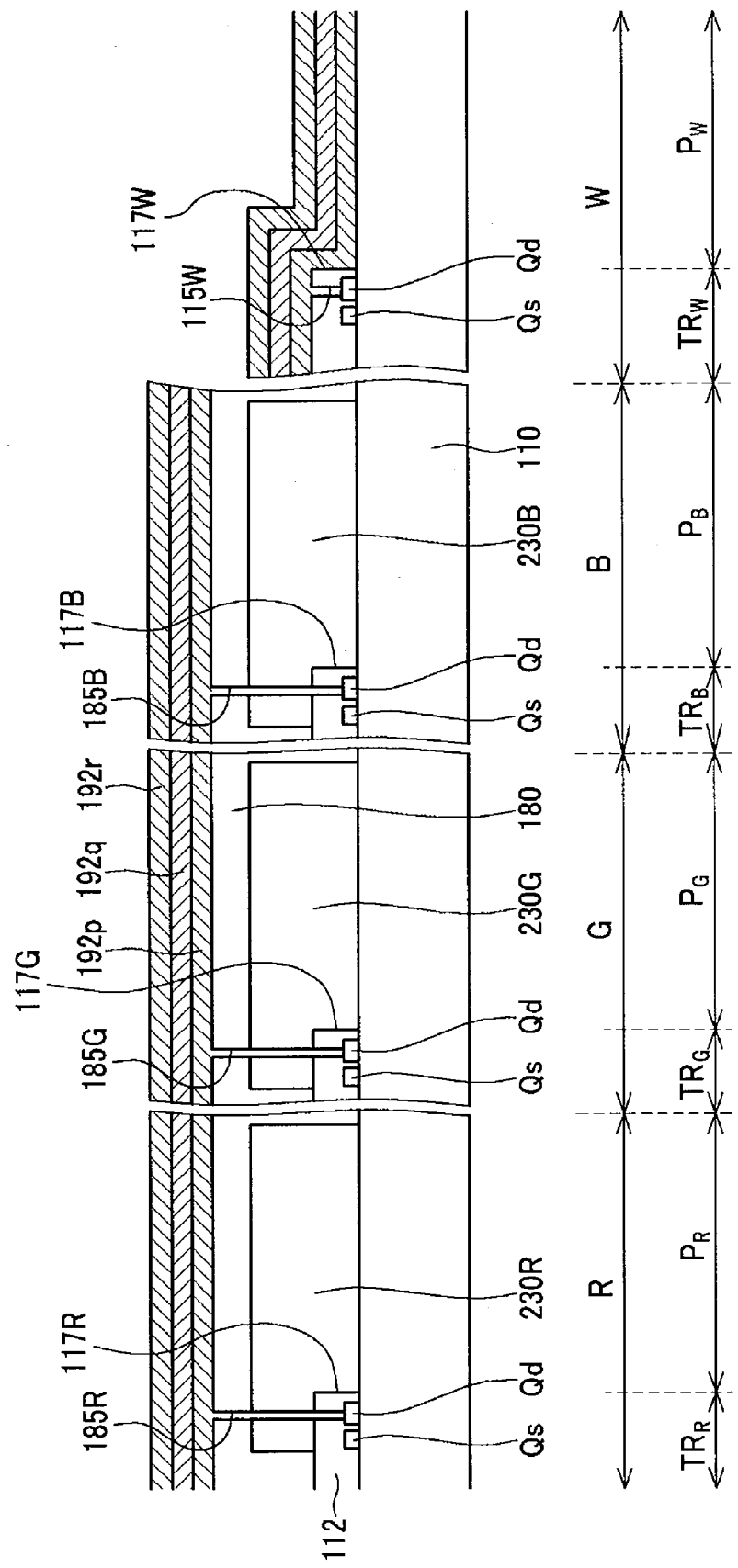

Next, referring to FIG. 9, a lower layer 192p made of silicon nitride, a middle layer 192q made of silicon oxide, and an upper layer 192r made of silicon nitride are sequentially deposited on the overcoat 180. Here, it is preferable that the deposition is executed at a low temperature of less than about 200° C. by chemical vapor deposition.

Figure 10:
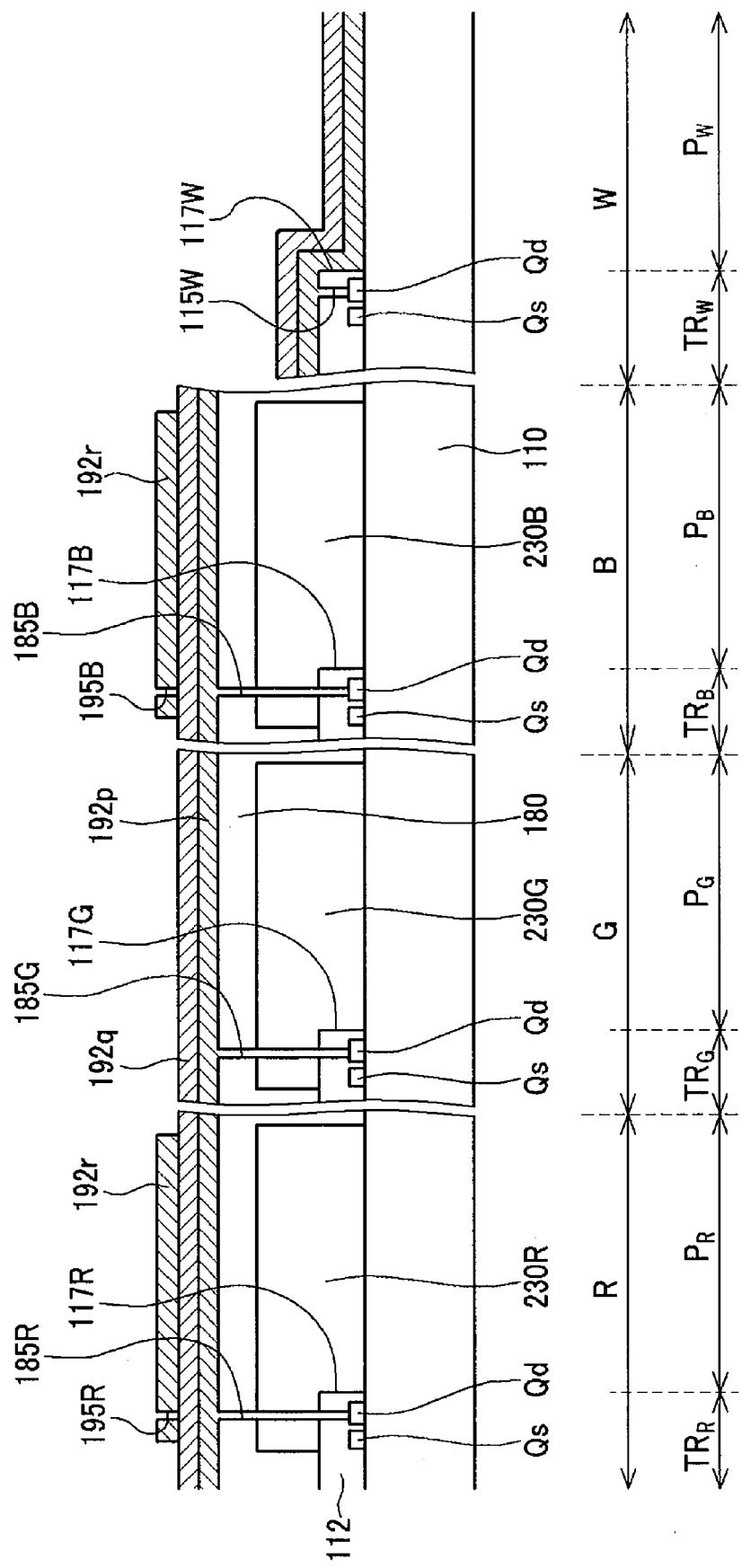

Next, referring to FIG. 10, the upper layer 192r at the green pixel G and the white pixel W is etched. Also, a portion of the upper layer 192r at the red pixel R and the blue pixel B is etched to form upper contact holes 195R and 195B on the positions corresponding to the middle contact holes 185R and 185B. Here, the etch gas may be $CF_4$ and $O_2$ gas, and the upper layer 192r made of silicon nitride may be selectively etched.

Figure 11:
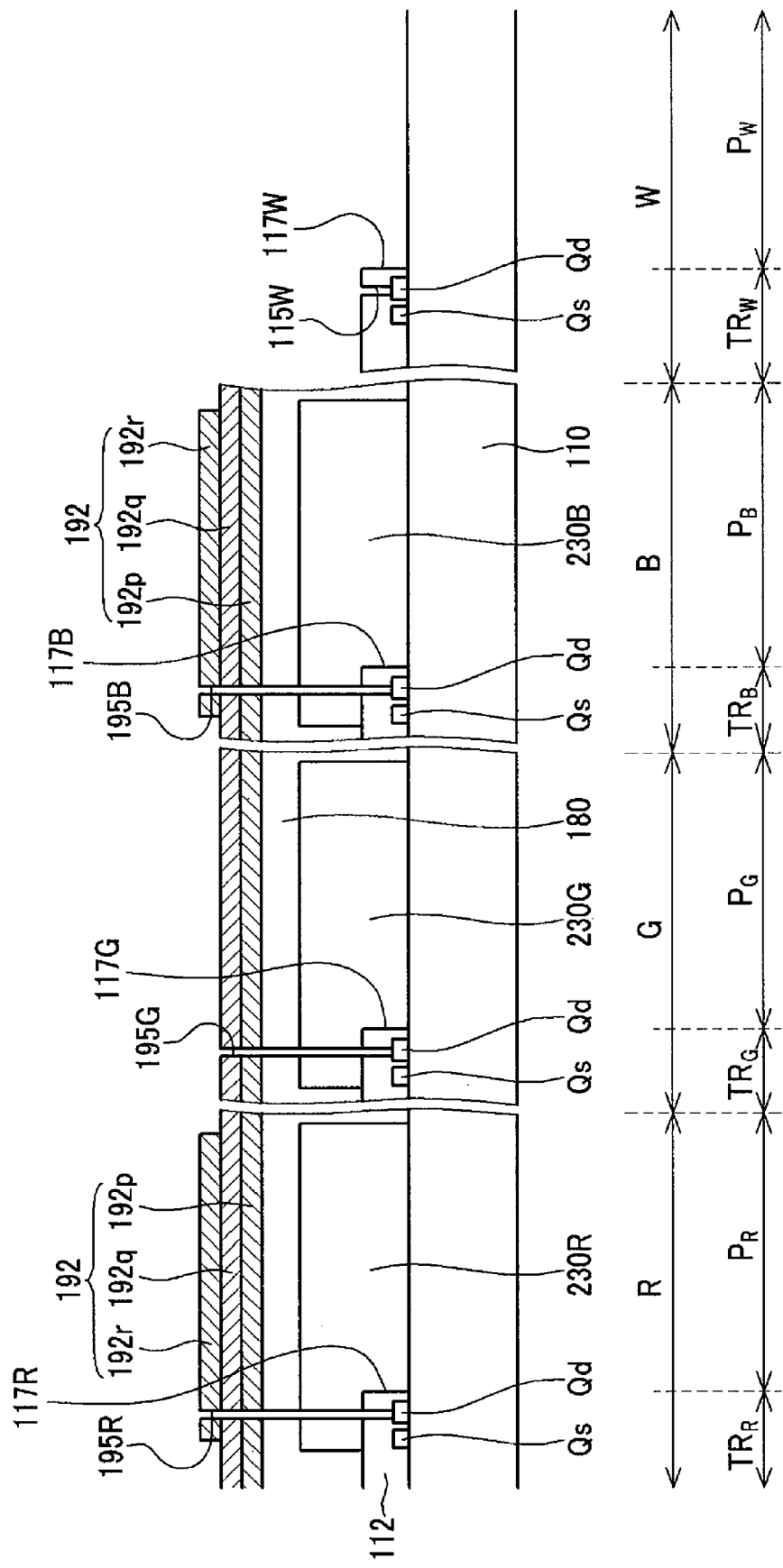

Next, referring to FIG. 11, the lower layer 192p and the middle layer 192q of the white pixel W are etched. Also, a portion of the middle layer 192q and the lower layer 192p at the red pixel R, the green pixel G, and the blue pixel B are etched to form upper contact holes 195R, 195G, and 195B connected to the middle contact holes 185R, 185G, and 185B. Here, the etch gas can be $C_4F_8$ and $H_2$ gas, so that the middle layer 192q of silicon oxide and the lower layer 192p of silicon nitride may be simultaneously etched. In this manner, a transflective member 192 with three layers (including the lower layer 192p, the middle layer 192q, and the upper layer 192r) is formed in the red pixel R and the blue pixel B, and a transflective member with two layers (including the lower layer 192p and the middle layer 192q) is formed in the green pixel G. The transflective member is removed in the white pixel W.

Figure 12:
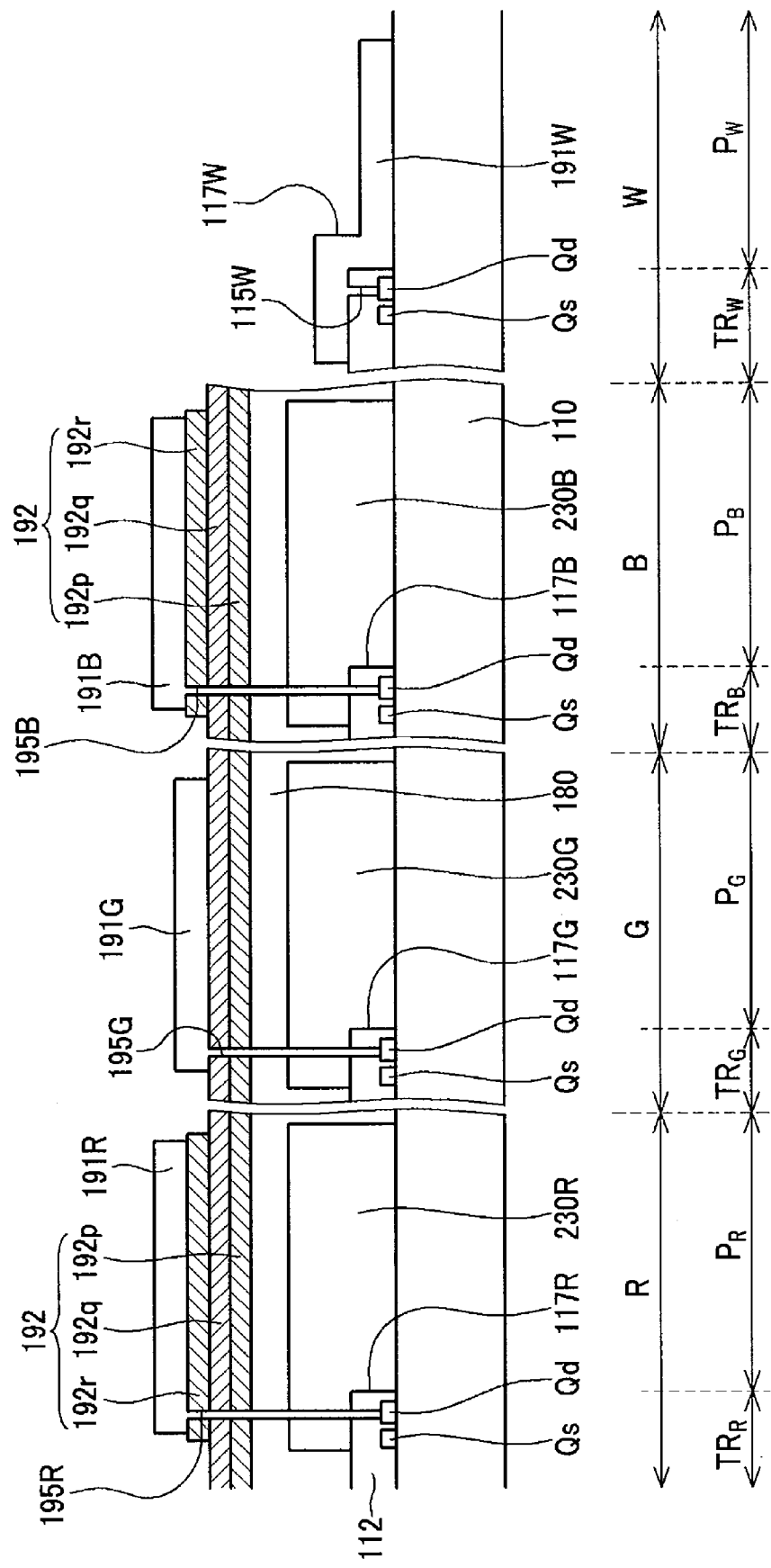

Next, referring to FIG. 12, a plurality of pixel electrodes 191R, 191G, and 191B are respectively formed on the transflective member 192 of the red pixel R, the green pixel G, and the blue pixel B, and a pixel electrode 191 is formed directly on the substrate 110 in the white pixel W.

Figure 13:
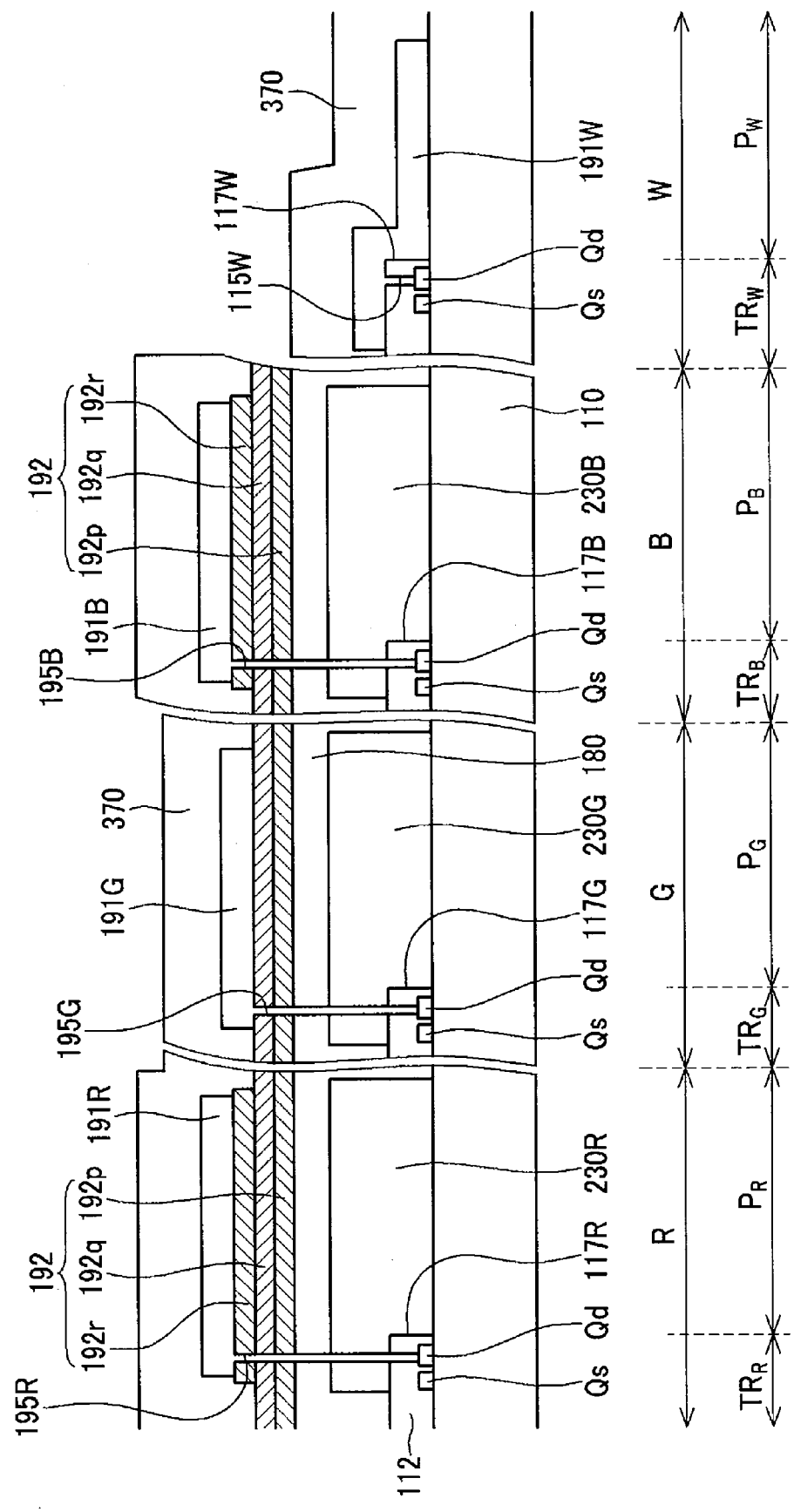

Referring to FIG. 13, a red emission layer (not shown), a blue emission layer (not shown), and a green emission layer (not shown) can be sequentially deposited on the whole surface of the substrate to form an emission layer 370. Here, the emission layer 370 may be repeatedly deposited.

Next, referring to FIG. 3, a common electrode 270 is formed on the emission layer 370.

In an exemplary embodiment of the present invention, the transflective member 192 is completely removed in the white pixel W. Also, the overcoat 180 and the lower insulating layer 112 are removed in the light emitting region of the white pixel W. Accordingly, the white light emitted from the emission layer 370 is only passed through the pixel electrode 191 and the substrate 110 and is emitted to the outside. As above-described, the transflective member 192, the overcoat 180, and the lower insulating layer 112 are removed in the white pixel W, so that light emitted from the emission layer 370 is only passed through the pixel electrode 191 and the substrate 110 and is emitted from the device. This keeps emitted light from being changed by the refractive index of each of the thin films, i.e., unique white light is emitted. Also, in an exemplary embodiment of the present invention, the lower insulating layer 112 disposed in the light emitting regions of the red pixel R, the green pixel G, and the blue pixel B is removed such that the amount of the light that is absorbed by the lower insulating layer is reduced, thereby improving the light emitting efficiency. This is further explained with reference to FIG. 24A and FIG. 24B.

Figure 24A:
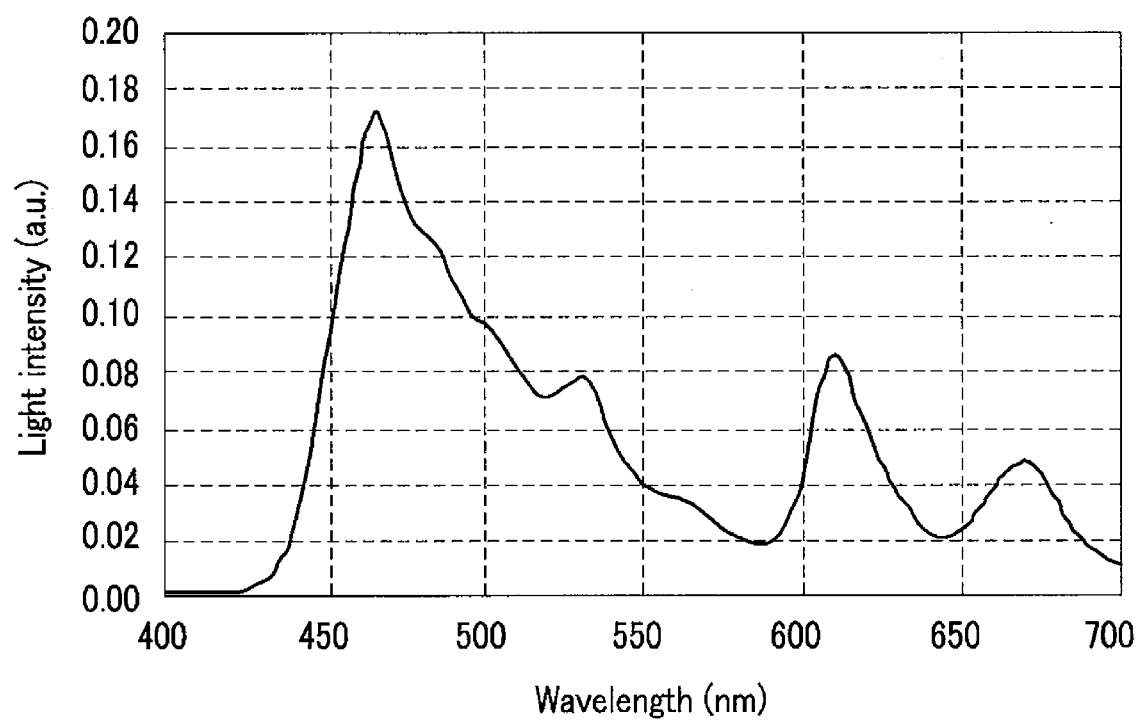
FIG. 24A is a graph showing a spectrum of the light passed through a white pixel (W) when overcoat 180 and lower insulating layer 112 are removed in a light emitting region of a white pixel (W).
Figure 24B:
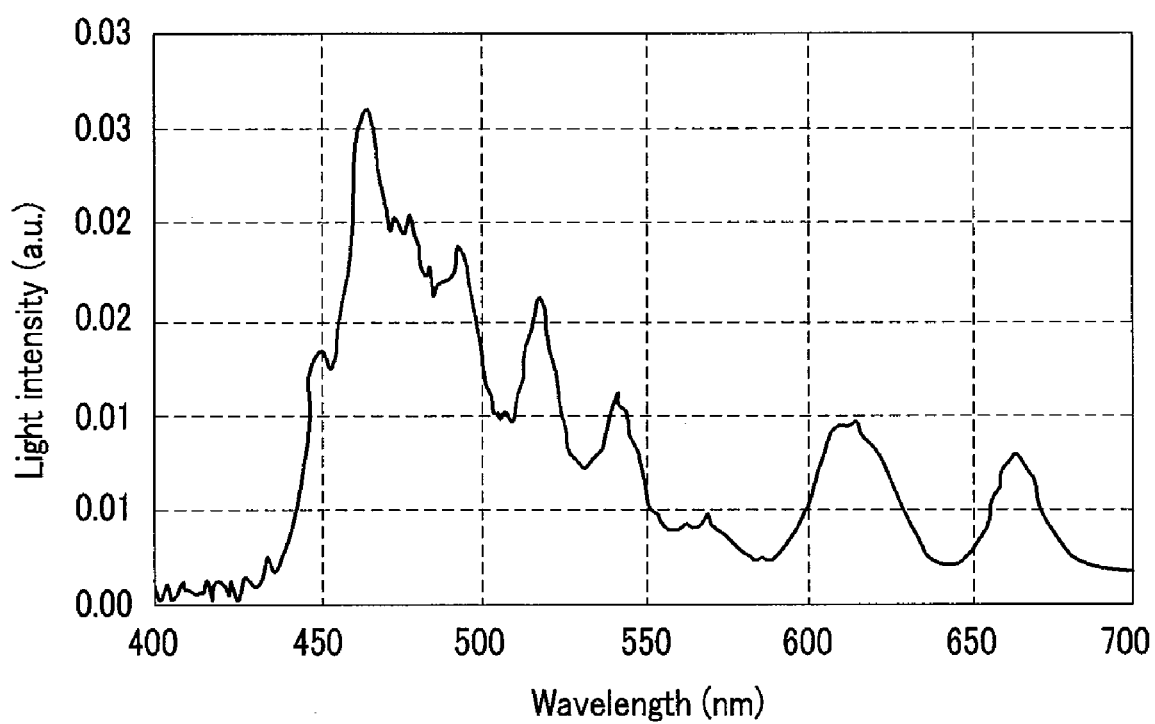
FIG. 24B is a graph showing a spectrum of light passed through a white pixel W when an overcoat 180 and lower insulating layer 112 are not removed in a light emitting region of a white pixel W.

FIG. 24A is a graph showing a spectrum of the light that has passed through a white pixel (W) in the case that an overcoat 180 and a lower insulating layer 112 are removed in a light emitting region of a white pixel W. FIG. 24B is a graph showing a spectrum of the light that has passed through a white pixel (W) in the case that an overcoat 180 and a lower insulating layer 112 are not removed in a light emitting region of a white pixel W. Comparing FIG. 24A and FIG. 24B, when the overcoat 180 and the lower insulating layer 112 are removed, the transmittance is not only improved, but the color purity and the color reproducibility are also increased in each of the wavelength regions, thereby improving the light emitting efficiency.

Also, the optical path lengths of the pixels may be formed differently by removing of the upper layer 192r of the portion of the pixels in the present exemplary embodiment. Here, the removal of the upper layer 192r requires one photolithography step such that the manufacturing process may be simplified compared with the several photolithography steps to respectively form the different optical path lengths in the red pixel R, the blue pixel B, and the green pixel G.

In the present exemplary embodiment, the optical path lengths of the red pixel R and the blue pixel B are the same and the optical path length of the green pixel G is different. However, the invention is not limited to this configuration. For example, the invention includes embodiments in which the optical paths of any of at least two pixels of the red pixel R, the green pixel G, and the blue pixel B are the same. Also, in the present exemplary embodiment, the emission layer 370 emits white light. However, the invention is not limited in this manner, and the red pixel R, the green pixel G, and the blue pixel B may respectively include a red emission layer, a green emission layer, and a blue emission layer, and the color filters 230R, 230G, and 230B disposed in each pixel may be omitted.

Exemplary Embodiment 2

Next, another exemplary embodiment of the present invention will be described with reference to FIG. 14 as well as FIG. 1 and FIG. 2. In this embodiment, descriptions of the same elements will be omitted, and the same constituent elements as in the above-described exemplary embodiment are indicated by the same reference numerals.

Figure 14:
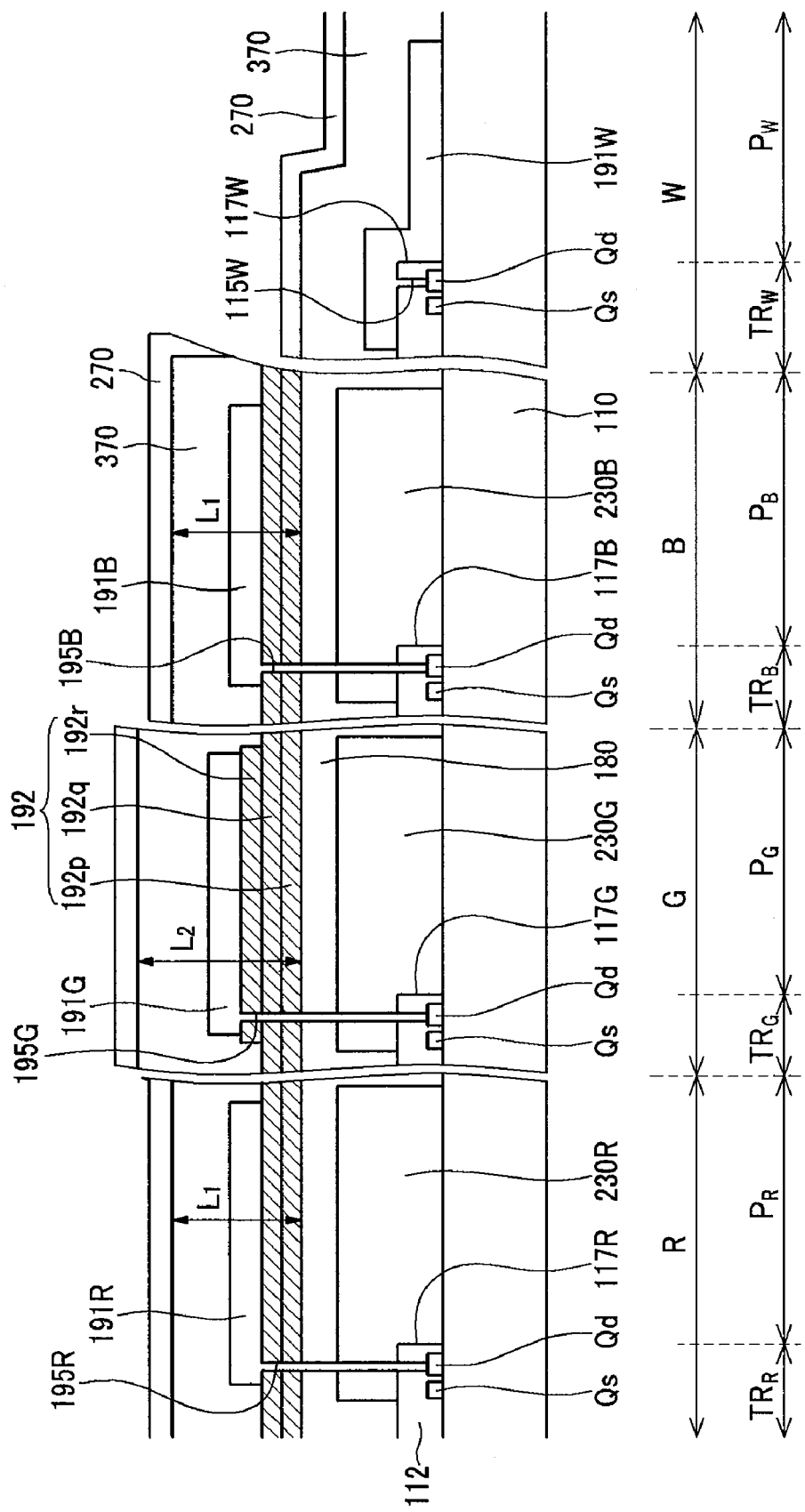
FIG. 14 is a cross-sectional view of an organic light emitting device according to another exemplary embodiment of the present invention.
Figure 15:
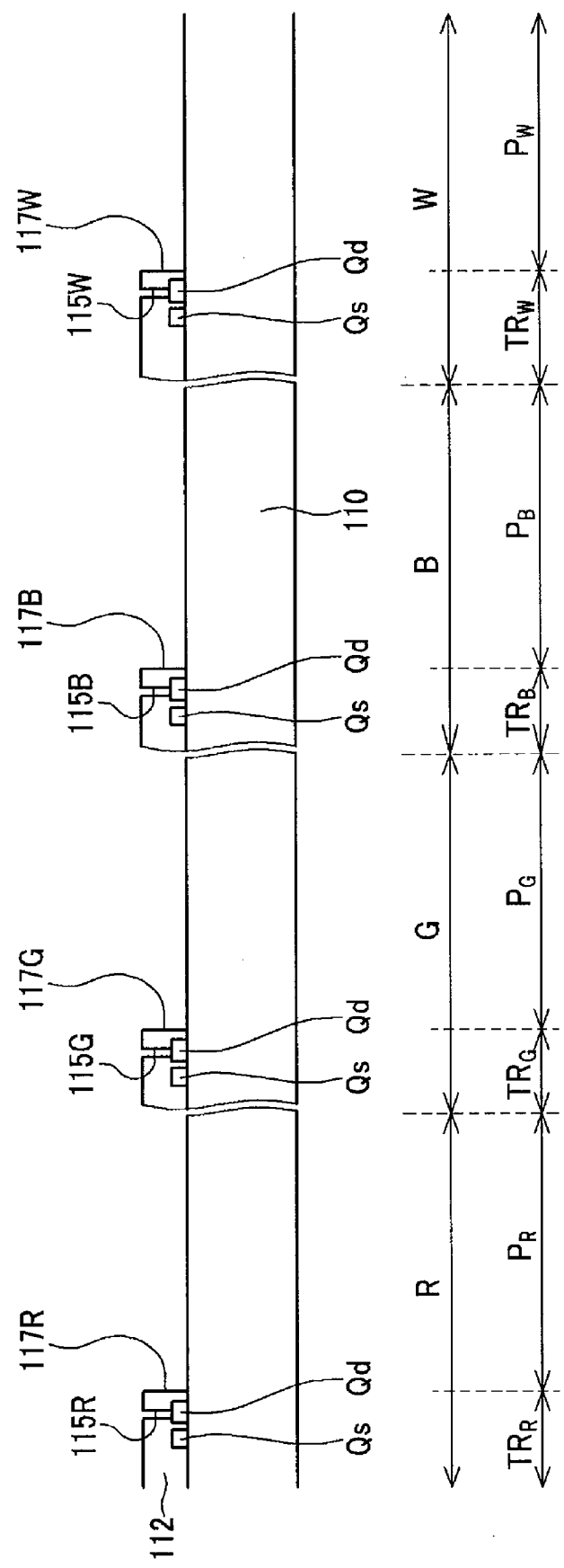
FIG. 15 to FIG. 23 are cross-sectional views sequentially showing the manufacturing method of FIG. 14.
Figure 16:
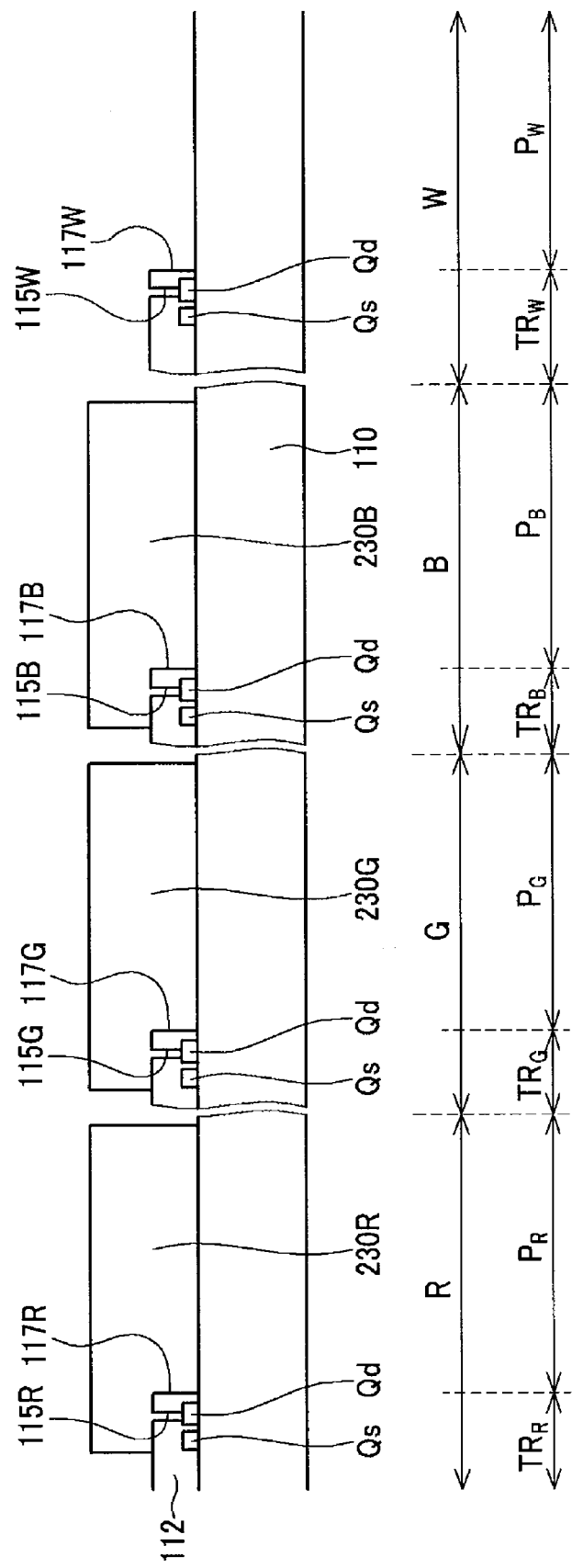

FIG. 14 is a cross-sectional view of an organic light emitting device according to another exemplary embodiment of the present invention. Here, an organic light emitting device includes a red pixel R, a green pixel G, a blue pixel B, and a white pixel W, like the previously described exemplary embodiment. Also, a plurality of switching thin film transistors Qs and a plurality of driving thin film transistors Qd are formed on an insulating substrate 110, and a lower insulating layer 112, color filters 230R, 230B, and 230G, and an overcoat 180 are formed thereon. In the light emitting regions $P_R$, $P_G$, $P_B$, and $P_W$ of each of the pixels R, G, B, and W, the lower insulating layer 112 is removed, and the overcoat 180 is removed in the white pixel W.

A transflective member 192 using distributed Bragg reflection is formed on the overcoat 180. The transflective member 192 includes a lower layer 192p, a middle layer 192q, and an upper layer 192r, and the upper layer 192r is removed from the red pixel R and the blue pixel B. The transflective member 192 is completely removed in the white pixel W. Among the transflective member 192, the lower layer 192p and the upper layer 192r are made of the same material and has first refractive index. The middle layer 192q is made of a material having a second refractive index. For example, the lower layer 192p and the upper layer 192r may be made of silicon nitride SiNx with a refractive index of about 1.8, and the middle layer 192q may be made of silicon oxide SiO2 with a refractive index of about 1.5.

Pixel electrodes 191R, 191G, 191B, and 191W, an emission layer 370, and a common electrode 270 are sequentially deposited on the transflective member 192.

In the present exemplary embodiment, like the previous embodiment, light of a predetermined wavelength is amplified in the red pixel R, the green pixel G, and the blue pixel B through the micro-cavity effect between the transflective member 192 and the common electrode 270, thereby improving the color reproducibility and the color impurity. For this micro-cavity effect, the optical path lengths of at least two pixels among the red pixel R, the green pixel G, and the blue pixel B are the same. This means that fewer process are required to yield the different optical path lengths for each pixel. Additionally, and in contrast to the previous embodiment, the optical path length $L_2$ of the green pixel G may be larger than the optical path length $L_1$ of the red pixel R and the blue pixel B. The optical path length $L_1$ that simultaneously satisfies the constructive interference condition in the red pixel R and the blue pixel B may be represented as in Equation 1 above. The optical path length $L_2$ of the green pixel G may be represented as:

$$L_2=(m+1)\lambda_3/2 \quad (3)$$

Here, m is a natural number, and $\lambda_1$, $\lambda_2$, and $\lambda_3$ are respectively the wavelengths of the red, blue, and green regions. For example, it may be that m=1.

The optical path lengths $L_1$ and $L_2$ may be determined by the transflective member 192, as the above-described upper layer 192r is only formed in the green pixel R, and is not present in the green pixel G or the blue pixel B. That is, the thickness of the upper layer 192r may control the optical path length. On the other hand, there is no micro-cavity associated with the white pixel W, as it is not necessary to additionally control the optical path length of light from that pixel.

A manufacturing method of the organic light emitting device shown in FIG. 14 is now described with reference to FIG. 15 to FIG. 23. FIG. 15 to FIG. 23 are cross-sectional views sequentially showing a manufacturing method for the organic light emitting device shown in FIG. 14. Referring FIG. 15, a plurality of thin film transistor arrays, including a plurality of switching thin film transistors Qs and a plurality of driving thin film transistors Qd, are formed on an insulating substrate 110. Here, the forming of the switching thin film transistor Qs and the driving thin film transistor Qd include deposition and patterning of a conductive layer, an insulating layer, and a semiconductor layer.

Next, a lower insulating layer 112 is deposited on the thin film transistor array and the substrate 110, and is patterned to form a plurality of lower contact holes 115R, 115G, 115B, and 115W respectively exposing the driving thin film transistor Qd of the red pixel R, the green pixel G, the blue pixel B, and the white pixel W. Also, the lower insulating layer 112 disposed in the light emitting regions $P_R$, $P_G$, $P_B$, and $P_W$ of the red pixel R, the green pixel G, the blue pixel B, and the white pixel W is removed to form a plurality of openings 117R, 117G, 117B, and 117W respectively exposing the substrate 110. Next, referring to FIG. 16, a plurality of color filters 230R, 230G, and 230B are formed on the lower insulating layer 112 and the substrate 110. A color filter is not formed in the white pixel W.

Figure 17:
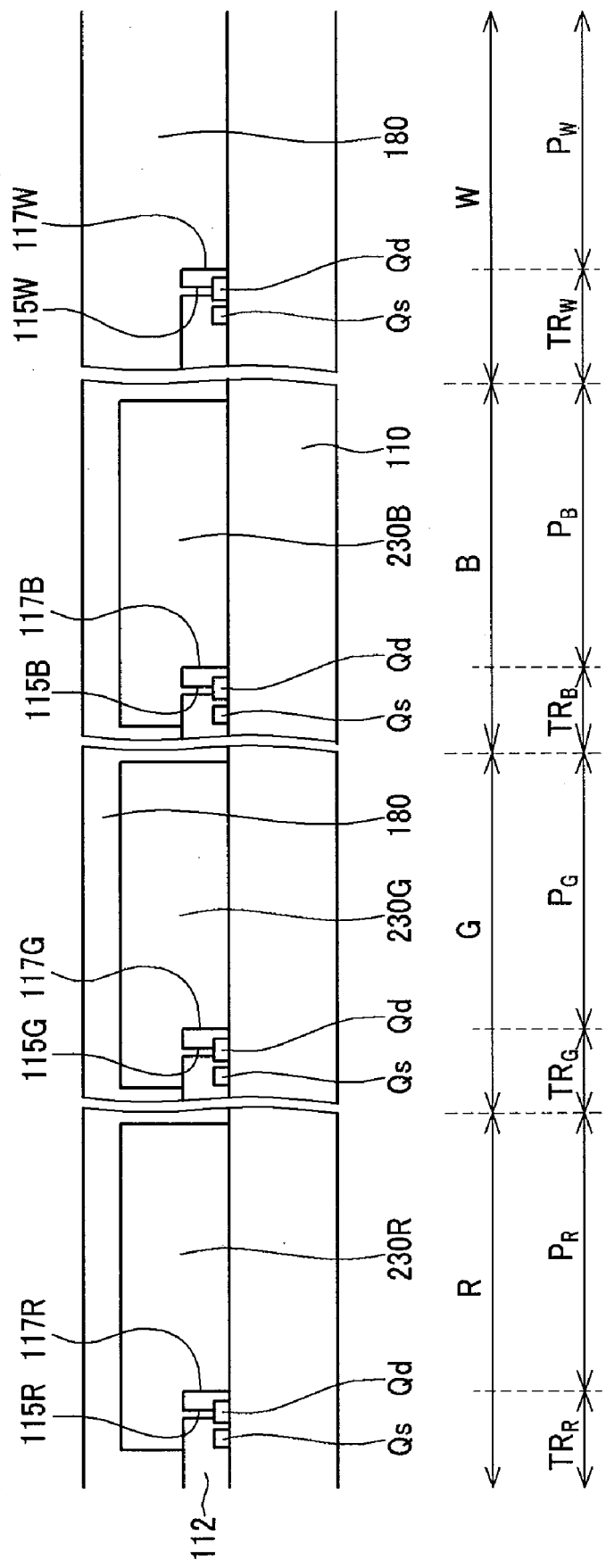
Figure 18:
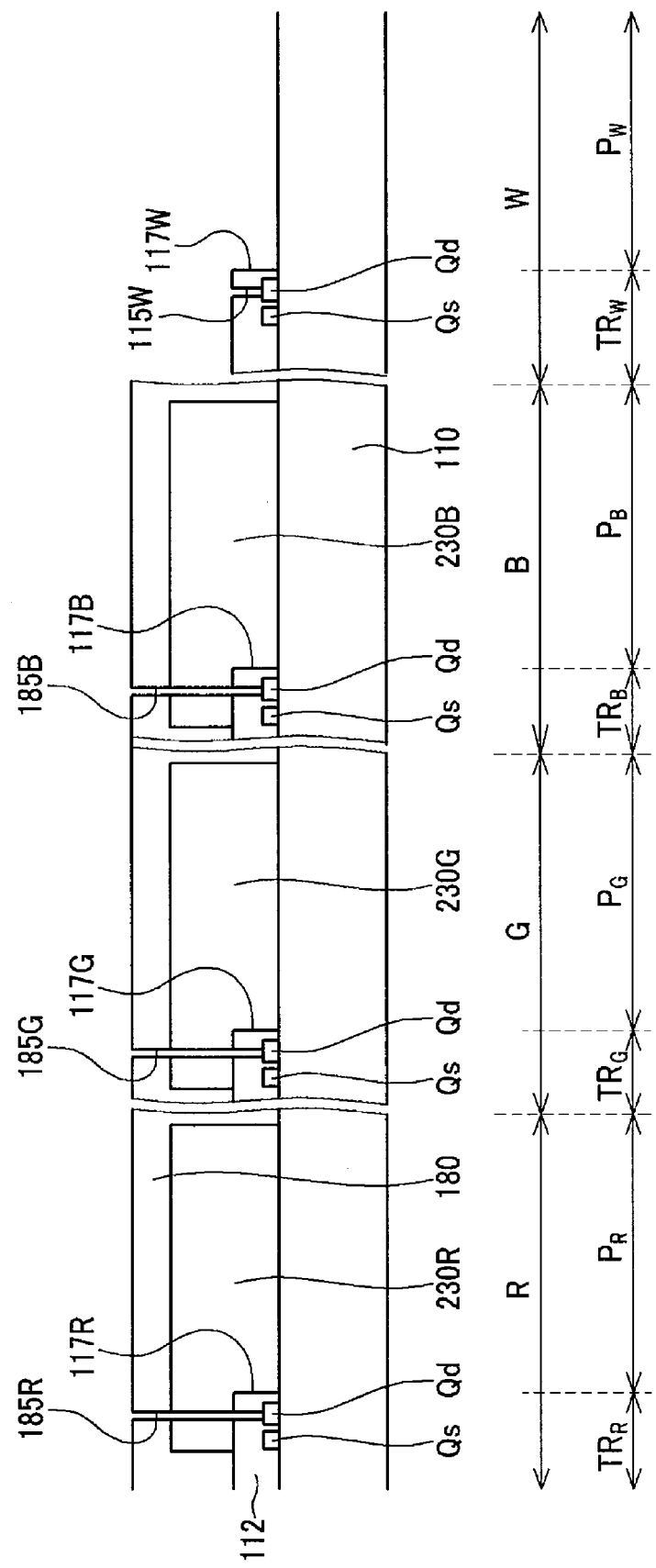

Next, referring to FIG. 17, an overcoat 180 is formed on the whole surface of the substrate including the lower insulating layer 112 and the color filters 230R, 230G, and 230B. Referring to FIG. 18, the overcoat 180 and the color filters 230R, 230G, and 230B are patterned to form a plurality of middle contact holes 185R, 185G, and 185B respectively exposing the lower contact holes 115R, 115G, and 115B, and to remove the overcoat 180 of the white pixel W. However, the overcoat 180 may be not removed in the white pixel W.

Figure 19:
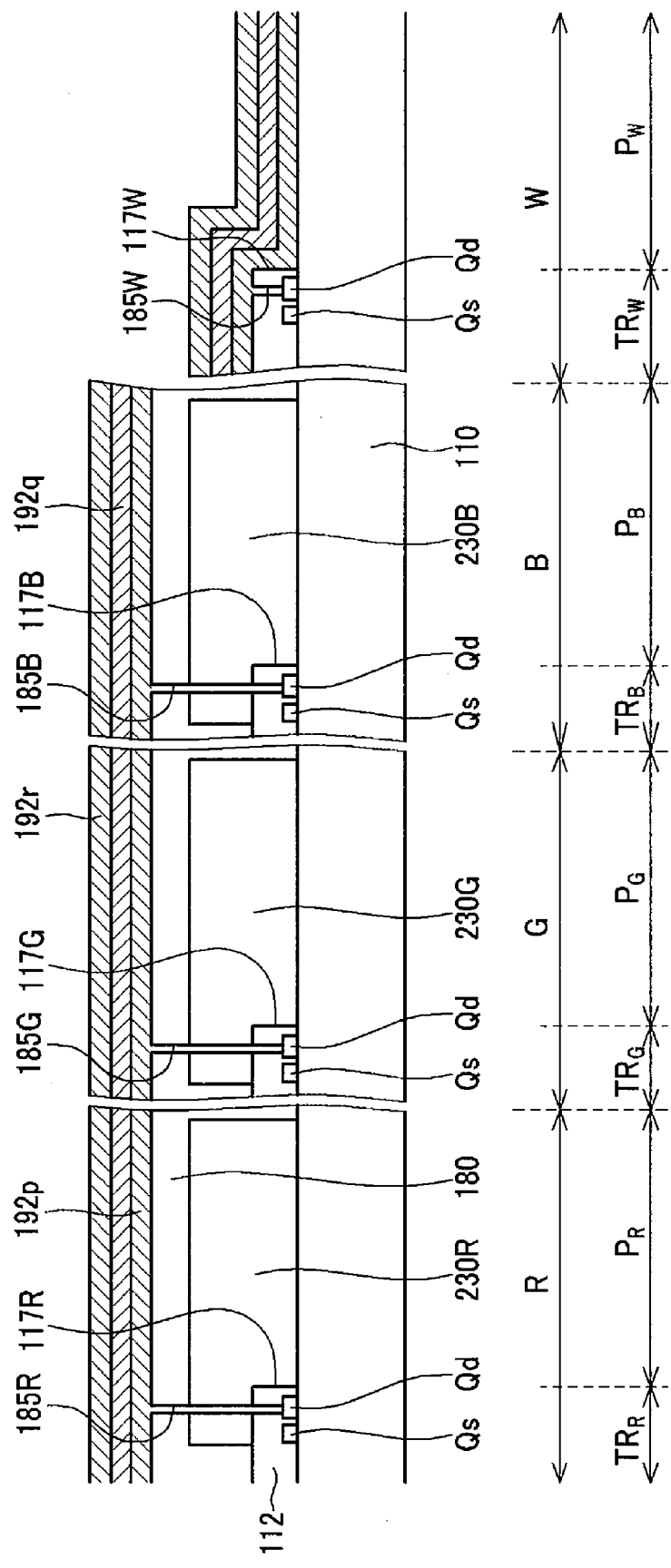

Next, referring to FIG. 19, a lower layer 192p made of silicon nitride, a middle layer 192q made of silicon oxide, and an upper layer 192r made of silicon nitride are sequentially deposited on the overcoat 180. Here, it is preferable that the deposition is executed at a low temperature of less than about 200° C. by chemical vapor deposition.

Figure 20:
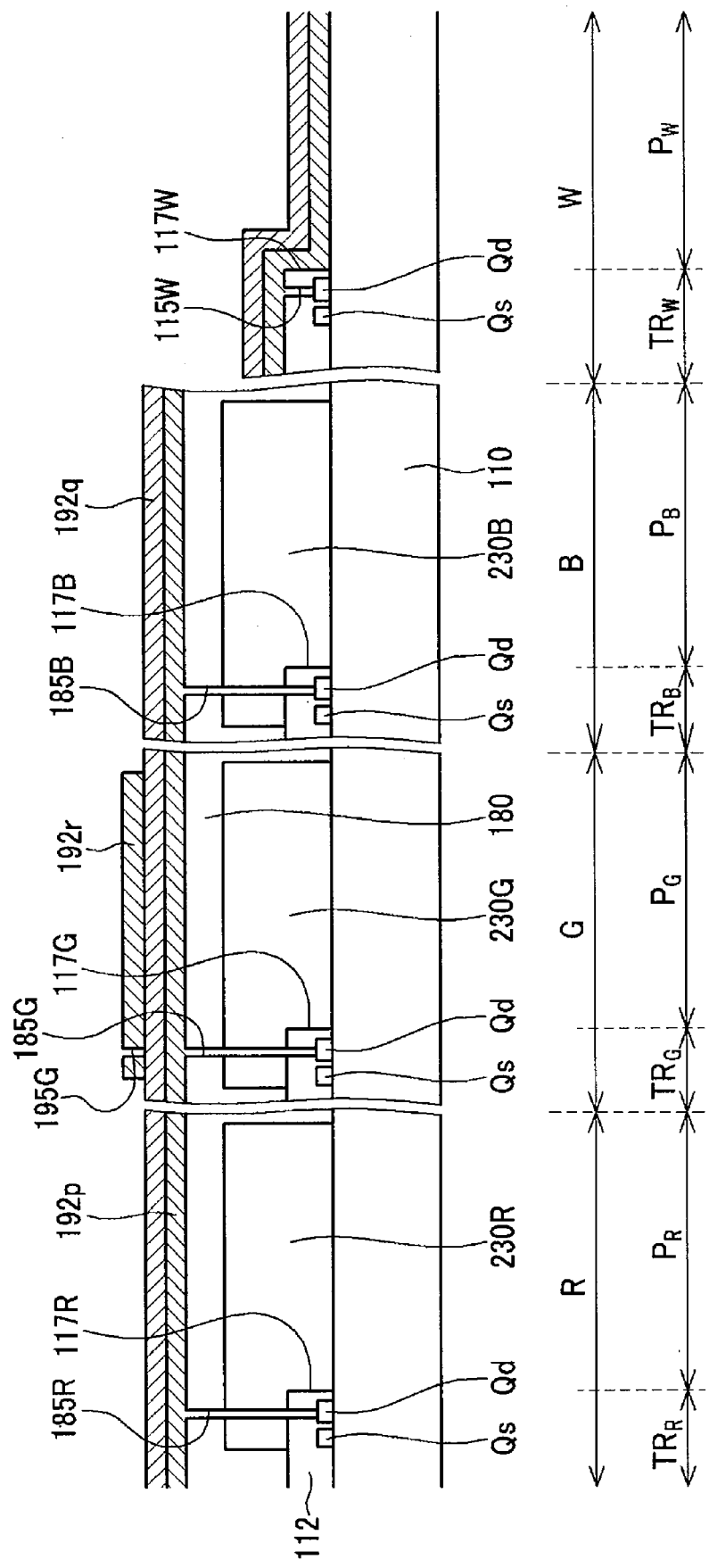

Next, referring to FIG. 20, the upper layer 192r of the red pixel R, the blue pixel B, and the white pixel W is etched. Also, a portion of the upper layer 192r of the green pixel G is etched to form an upper contact hole 195G on the positions corresponding to the middle contact hole 185G. Here, the etch gas may be $CF_4$ and $O_2$ gas, and the upper layer 192r made of silicon nitride may be selectively etched.

Figure 21:
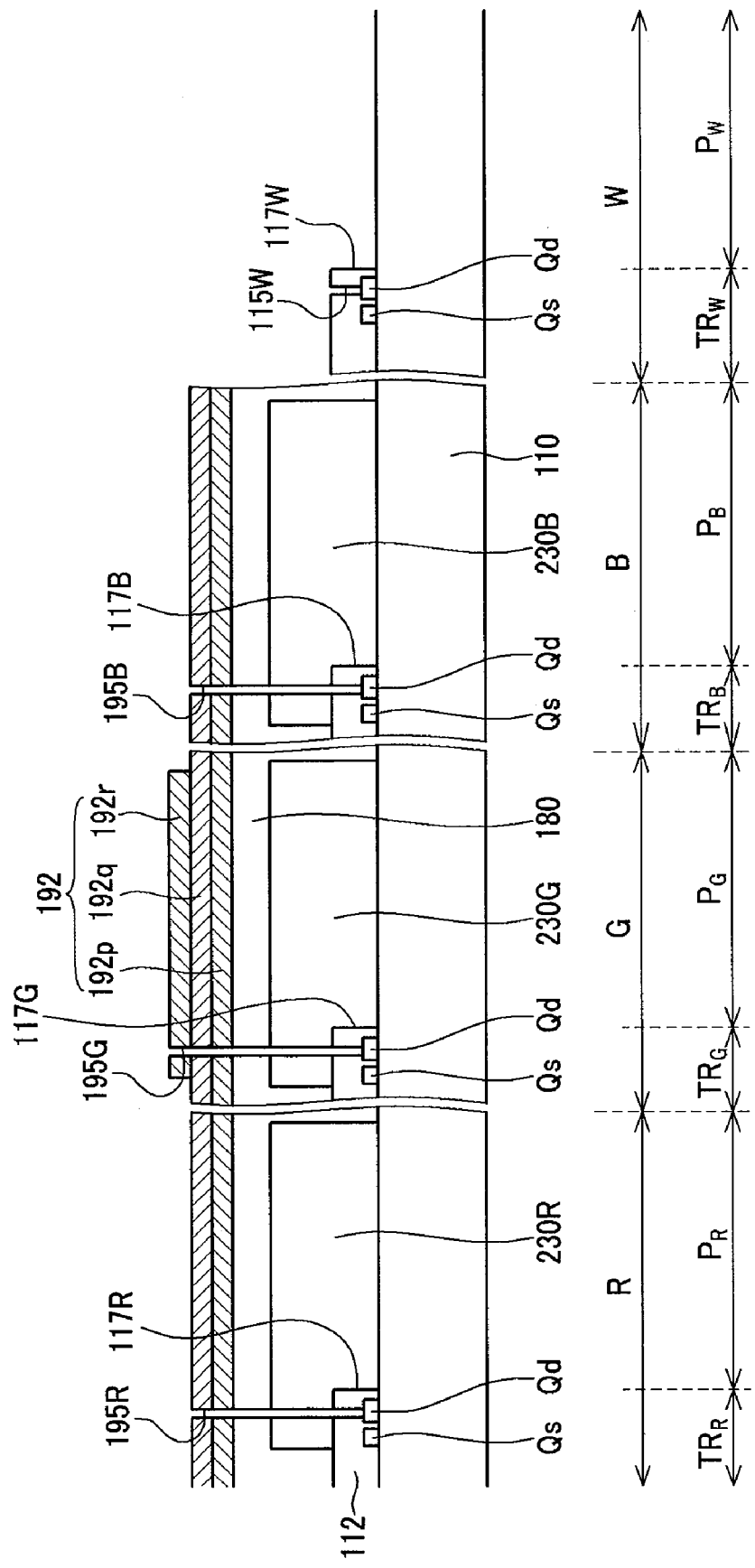

Next, referring to FIG. 21, the lower layer 192p and the middle layer 192q of the white pixel W are etched. Also, a portion of the middle layer 192q and the lower layer 192p of the red pixel R, the green pixel G, and the blue pixel B are etched to form upper contact holes 195R, 195G, and 195B connected to the middle contact holes 185R, 185G, and 185B, respectively. Here, the etch gas is $C_4F_8$ and $H_2$ gas or another suitable gas or gases, such that the middle layer 192q of silicon oxide and the lower layer 192p of silicon nitride may be simultaneously etched.

In this manner, a transflective member 192 is fabricated with three layers (including the lower layer 192p, the middle layer 192q, and the upper layer 192r) in the green pixel G, and two layers (including the lower layer 192p and the middle layer 192q) in the red pixel R and the blue pixel B. The transflective member is removed in the white pixel W.

Figure 22:
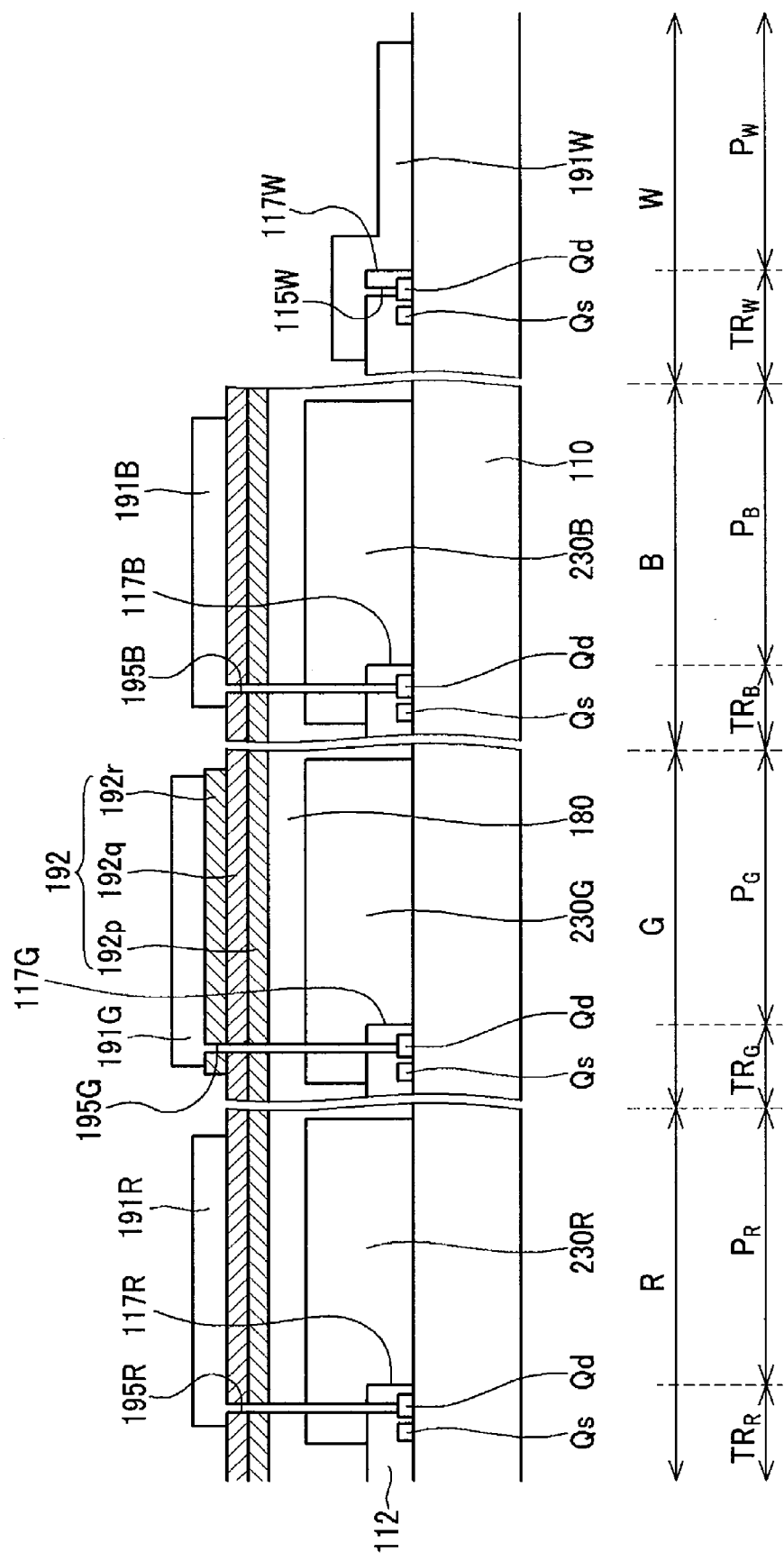
Figure 23:
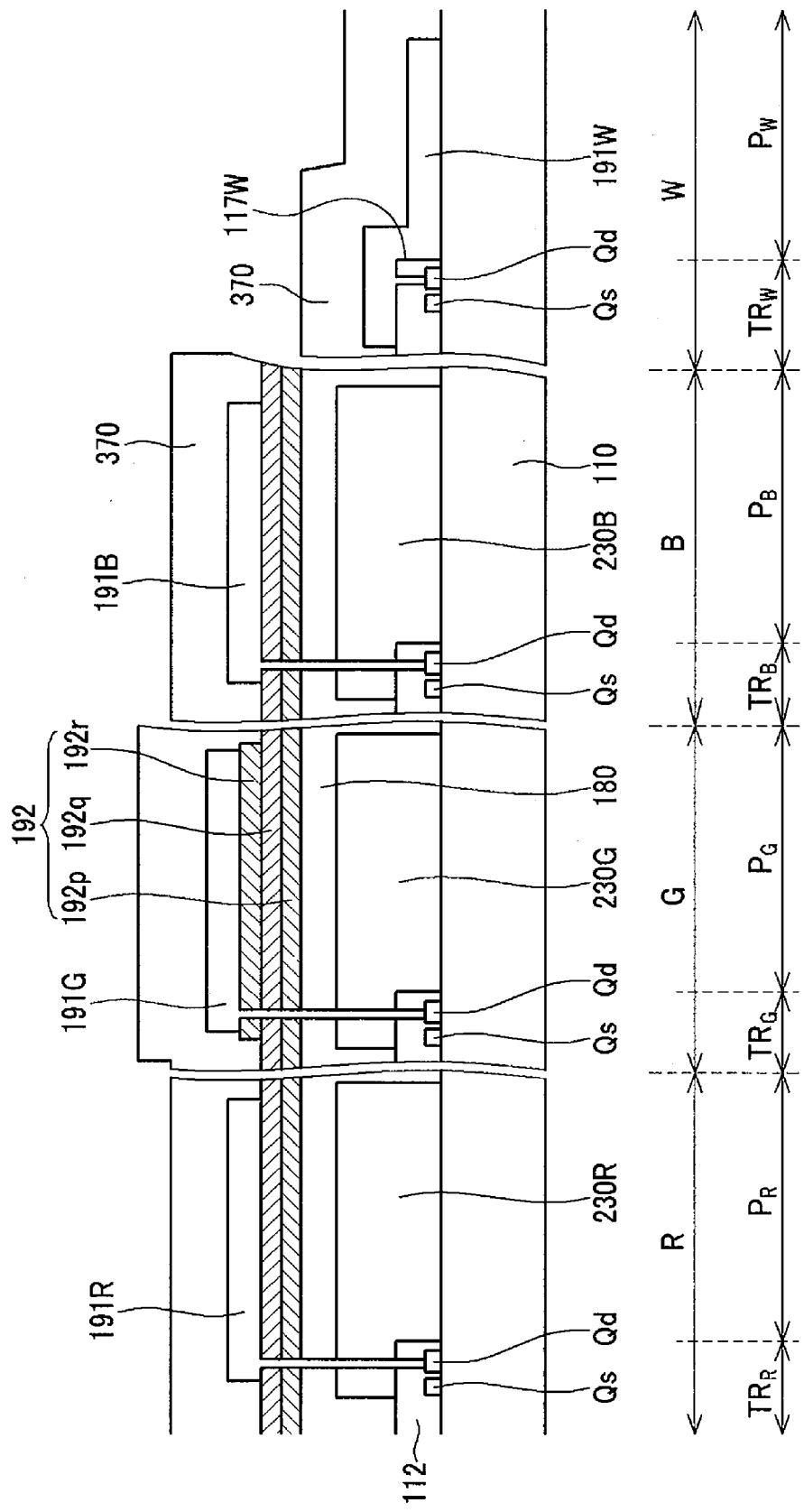

Next, referring to FIG. 22, a plurality of pixel electrodes 191R, 191G, and 191B are respectively formed on the transflective member 192 of the red pixel R, the green pixel G, and the blue pixel B and a pixel electrode 191W is formed directly on the substrate 110 in the white pixel W. Referring to FIG. 23, a red emission layer (not shown), a blue emission layer (not shown), and a green emission layer (not shown) are sequentially deposited on the whole surface of the substrate to form an emission layer 370. Here, the emission layer 370 may be repeatedly deposited. Finally, referring to FIG. 14, a common electrode 270 is formed on the emission layer 370.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising a first pixel, a second pixel, and a third pixel displaying different colors from each other, and a white pixel, wherein the organic light emitting device comprises:
   a substrate;
   a pixel electrode formed on the substrate;
   a reflecting electrode facing the pixel electrode;
   an emission layer disposed between the pixel electrode and the reflecting electrode; and
   a transflective member;
   wherein a optical path length is a distance between the reflecting electrode and the transflective member;
   wherein optical path lengths of at least two of the first pixel, the second pixel, and the third pixel are substantially the same; and
   wherein the transflective member is not disposed in the white pixel.

2. The organic light emitting device of claim 1, wherein the substrate and the pixel electrode of the white pixel contact each other.

3. The organic light emitting device of claim 2, wherein:
   the transflective member comprises a plurality of layers in which a first layer and a second layer having different refractive indices are alternately deposited.

4. The organic light emitting device of claim 3, wherein the optical path lengths of the first pixel and the second pixel are substantially the same, and
   at least one layer is formed in the first pixel and in the second pixel but not in the third pixel.

5. The organic light emitting device of claim 4, wherein the first pixel is a red pixel, the second pixel is a blue pixel, and the third pixel is a green pixel.

6. The organic light emitting device of claim 5, wherein:
   the optical path length $L_1$ of the first pixel and the second pixel satisfies $L_1=m\lambda_1/2=(m+1)\lambda_2/2$; and
   the optical path length $L_2$ of the third pixel satisfies $L_2=m\lambda_3/2$,
   where m is a natural number, $\lambda_1$ is a wavelength of the red region, $\lambda_2$ is a wavelength of the blue region, and $\lambda_3$ is a wavelength of the green region.

7. The organic light emitting device of claim 3, wherein the optical path lengths of the first pixel and the second pixel are substantially the same, and
at least one of the layers is formed in the third pixel, and is not disposed in from the first pixel and the second pixel.

8. The organic light emitting device of claim 7, wherein the first pixel is a red pixel, the second pixel is a blue pixel, and the third pixel is a green pixel.

9. The organic light emitting device of claim 8, wherein:
   the optical path length $L_1$ of the first pixel and the second pixel satisfies $L_1=m\lambda_1/2=(m+1)\lambda_2/2$; and
   the optical path length $L_2$ of the third pixel satisfies $L_2=(m+1)\lambda_3/2$,
   wherein $\lambda_1$ is a wavelength of the red region, $\lambda_2$ is a wavelength of the blue region, and $\lambda_3$ is a wavelength of the green region.

10. The organic light emitting device of claim 1, wherein the organic light emitting device further comprises:
    a thin film transistor formed on the substrate, an insulating layer that is at least one of formed on and formed under the thin film transistor, and an overcoat formed on the insulating layer;
    wherein the insulating layer is not disposed in the light emitting region of the white pixel.

11. The organic light emitting device of claim 10, wherein the insulating layer is not disposed in the light emitting regions of the first pixel, the second pixel, and the third pixel.

12. The organic light emitting device of claim 10, wherein the overcoat is not disposed in the white pixel.

13. The organic light emitting device of claim 1, further comprising color filters respectively formed in the first pixel, the second pixel, and the third pixel.

14. The organic light emitting device of claim 13, wherein the emission layer comprises:
    a plurality of sub-emission layers configured to emit light of different wavelengths;
    wherein a white light is emitted by combining the light of different wavelengths.

15. The organic light emitting device of claim 3, wherein at least one of the first layer and the second layer is not disposed in a portion of at least one of the first pixel, the second pixel, and the third pixel.

16. The organic light emitting device of claim 3 further comprising:
    an overcoat disposed between the substrate and the transflective member, and
    wherein one of the first layer and the second layer that is closer to the overcoat has a larger refractive index than the other.

17. The organic light emitting device of claim 16, wherein the one layer of the first layer and the second layer that is closer to the overcoat comprises silicon nitride, and the other of the first layer and the second layer comprises silicon oxide.

* * * * *